United States Patent
Dervay et al.

(10) Patent No.: US 11,817,872 B1
(45) Date of Patent: Nov. 14, 2023

(54) FREQUENCY STABILIZED AND PHASE NOISE SUPPRESSED MICROWAVE SOURCE USING AN IQ MIXER TO DETECT AMPLITUDE MODULATION AND PHASE PERTURBATION OF THE REFLECTED SIGNAL

(71) Applicant: Raytheon Company, Waltham, MA (US)

(72) Inventors: James Andrew Dervay, Hudson, MA (US); Gary Ian Moore, Fremantle, WA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 18/095,855

(22) Filed: Jan. 11, 2023

(51) Int. Cl.
*H03L 7/187* (2006.01)
*H03L 7/107* (2006.01)

(52) U.S. Cl.
CPC .............. *H03L 7/187* (2013.01); *H03L 7/107* (2013.01)

(58) Field of Classification Search
CPC ................................ H03L 7/187; H03L 7/107
USPC ........... 331/16, 1 A; 375/376, 296; 327/156, 327/159; 455/139, 214; 330/149
See application file for complete search history.

(56) References Cited

U.S. PATENT DOCUMENTS

| | | | |
|---|---|---|---|
| 2,589,861 A | 3/1952 | Pound | |
| 2,593,463 A | 4/1952 | Kinzer | |
| 2,681,998 A | 6/1954 | Pound | |
| 2,705,752 A | 4/1955 | Pound | |
| 2,714,662 A | 8/1955 | Norton | |
| 2,873,370 A | 2/1959 | Pound | |
| 10,009,103 B2 | 6/2018 | Vahala et al. | |
| 10,700,492 B2 | 6/2020 | Idjadi et al. | |
| 11,424,841 B1 * | 8/2022 | Mohindra | H04B 17/14 |

OTHER PUBLICATIONS

Barnes, C.A., et al., "Residual PM Noise Evaluation of Radio Frequency Mixers", 2011 Joint Conference of the IEEE International Frequency Control and the European Frequency and Time Forum (FCS) Proceedings, San Francisco, CA, USA, (2011), 1-5.
Feng, Yin, "Laser Frequency Stabilization With Pound-Drever-Hall Technique", A Thesis Presented to the Faculty of the Graduate School of Cornell University, (May 2015), 38 pgs.

(Continued)

*Primary Examiner* — Arnold M Kinkead
(74) *Attorney, Agent, or Firm* — Schwegman Lundberg & Woessner, P.A.

(57) ABSTRACT

An IQ mixer is used in a Pound-stabilized microwave source to detect amplitude modulation of the signal reflected from the reference resonator. By properly configuring the IQ mixer so that the LO and RF inputs are maintained in quadrature at the Q mixer, hence in-phase at the I mixer, lower levels of amplitude modulation may be detected at lower modulation frequencies compatible with optimal choices of resonator coupling and maximal phase to amplitude conversion. With the Q mixer held in quadrature it acts as a broadband phase noise detector. A portion of the Q mixer output is bandpass filtered and summed with the I mixer Pound-server voltage to achieve both center frequency stabilization and broadband phase noise suppression.

19 Claims, 13 Drawing Sheets

(56) References Cited

OTHER PUBLICATIONS

Grop, Serge, et al., "Flicker Noise of Microwave Power Detectors", 2009 IEEE International Frequency Control Symposium Joint with the 22nd European Frequency and Time forum, (2009), 40-43.
Kersalé, Y., et al., "Comparison of WGE and WGH Modes for Temperature Compensated Sapphire-Rutile Resonator", IEEE International Frequency Control Symposium and PDA Exhibition Jointly with the 17th European Frequency and Time Forum, (2003), 360-364.
Kurtz, Stephan R., "Mixers as Phase Detectors", The Communications Edge™, (2001), 8 pgs.
Luiten, A.N., et al., "Cryyogenic Sapphire Resonator-Oscilator With Exceiti0na.l. Stability: An Update", 1994 IEEE International Frequency Control Symposium, (1994), 441-446.
Luiten, A.N., et al., "Latest Results of the U.W.A. Cryogenic Sapphire Oscillator", Proceedings of the 1995 IEEE International Frequency Control Symposium (49th Annual Symposium), (1995), 433-437.
Pound, R.V., "Frequency Stabilization of Microwave Oscillators", Proceedings of the IRE, vol. 35, No. 12, (Dec. 1947), 1405-1415.

* cited by examiner

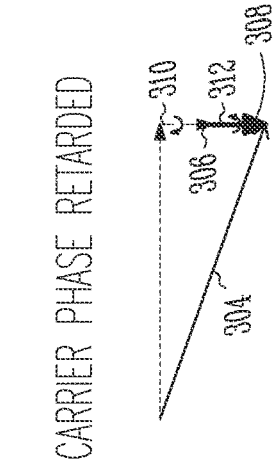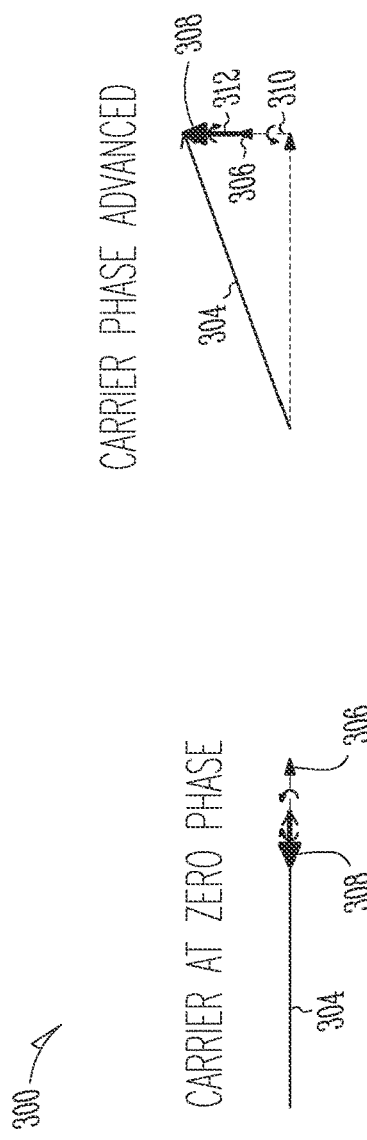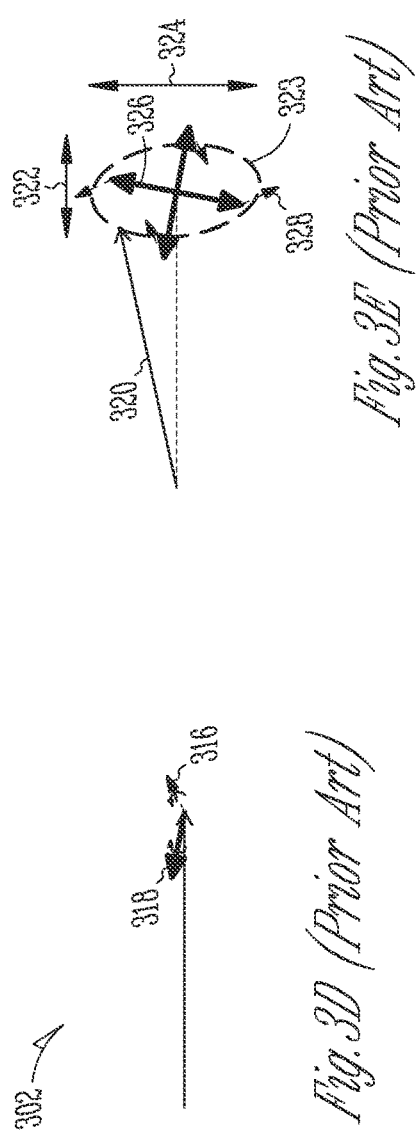

FREQUENCY STABILIZED AND PHASE NOISE SUPPRESSED MICROWAVE SOURCE USING AN IQ MIXER TO DETECT AMPLITUDE MODULATION AND PHASE PERTURBATION OF THE REFLECTED SIGNAL

BACKGROUND

Field

This disclosure relates to frequency stabilized microwave sources that use "Pound stabilization" or "Pound-servo" techniques, and more particularly to the use of an IQ mixer to detect the amplitude modulation and phase perturbation of the reflected signal. This dual use of the IQ mixer in a Pound-servo system simultaneously enables both center frequency stabilization and wideband phase noise suppression.

Description of the Related Art

Stable microwave frequency sources are used in applications such as radar and communications systems. The most stable microwave sources, for example, hydrogen masers or cryogenic sapphire oscillators, find application as the time base for accurate clocks. Such sources and clocks are bulky and unsuitable for portable devices which may require synchronization even when separated by large distances. Therefore, many such devices will synchronize by utilizing the time information provided by GPS signals. However, GPS reception may be unavailable for some periods and there is a need for small, low power, oscillators with sufficient stability to maintaining synchronization during such periods.

A simple oscillator may comprise a loop that includes at least a resonator, an amplifier, and a phase shifter. Together these may satisfy the oscillation conditions of gain and phase shift around the loop being greater than 1 and a multiple of 2N, respectively. A resonator with a highly stable center frequency does not immediately lead to a highly stable oscillation frequency if the phase shift through the amplifier and phase shifter are not also highly stable.

R. V. Pound, "Frequency Stabilization of Microwave Oscillators," in Proceedings of the IRE, vol. 35, no. 12, pp. 1405-1415, December 1947 described a technique which utilized the reflection of the microwave oscillator signal from a reference resonator to improve oscillator stability. In U.S. Pat. No. 2,681,998 Pound combined this technique with modulation of the oscillator signal to avoid limitations induced by flicker noise in microwave detectors. It has become common to refer to microwave oscillator stabilization techniques involving reflection of a modulated signal from a resonator as "Pound-stabilization" or "Pound-servo" techniques. More recently a single resonator is often utilized as both a component of a microwave oscillator loop as well as the stabilizing element used to improve the stability of the oscillator loop. See N. Luiten, A. G. Mann, N. J. McDonald and D. G. Blair, "Latest results of the U.W.A. cryogenic sapphire oscillator," Proceedings of the 1995 IEEE International Frequency Control Symposium (49th Annual Symposium), 1995, pp. 433-437 and N. Luiten, A. G. Mann, M. E. Costa and D. G. Blair, "Cryogenic sapphire resonator-oscillator with exceptional stability. an update," Proceedings of IEEE 48th Annual Symposium on Frequency Control, 1994, pp. 441-446.

Referring now to FIG. 1, a frequency stabilized microwave source 100 uses the Pound-stabilization technique to stabilize a microwave oscillator i.e., a voltage controlled oscillator (VCO) 102 against a reference resonator 104 to generate a frequency-stabilized output signal 106 at output port 108. The VCO generates an output signal 110, a portion of which is taken as frequency-stabilized output signal 106. The signal frequency can be tuned by a Pound-servo voltage 112 applied to the VCO's tuning port 114. Output signal 110 is passed through a phase shifter 116 and a circulator 118 before impinging on reference resonator 104. The frequency of the VCO 102 must be tunable to match the center frequency of the resonator, $f_{Res}$. Typically, the resonator may be a cavity resonator which may include a dielectric element, although the technique may be applied using any resonator with a suitable center frequency and stability.

A portion of the output signal 110 impinging on the resonator will be reflected in accordance with well-known properties of resonators as reflected signal 120. This reflected energy is directed by circulator 118 onto an amplitude detector 122 which is most commonly a simple diode detector. A modulation source 124 generates a modulation signal 125 at a modulation frequency, $f_m$ to apply phase modulation to output signal 110 impinging on the resonator by way of the phase shifter 116. As will be described in more detail below, the phase modulation may lead to amplitude modulation in the reflected signal 120 seen by the amplitude detector 122. Any such amplitude modulation will cause a fluctuating signal on the detector output, said fluctuation having the same modulation frequency $f_m$.

A synchronous detector 126 such as a synchronous rectifier mixes the output of the amplitude detector 122 with the modulation signal 125 to convert the fluctuation in amplitude detector output at modulation frequency $f_m$ into a DC frequency error voltage 128 representing the magnitude of the fluctuation. This DC frequency error voltage is then amplified and preferably integrated via integrator 130 to provide Pound-servo gain to produce Pound-servo voltage 112 that is fed to the tuning port 114 of VCO 102. The synchronous rectifier may also be known in the art by terms such as a synchronous detector, lock-in detector, lock-in amplifier or lock-in mixer.

To understand the operation of the frequency stabilized microwave source, consider an incident spectrum 200 of the signal impinging on the reference resonator as shown in FIG. 2A and a variation of a complex reflection coefficient 202 of the reference resonator with frequency as separate magnitude and phase plots 204 and 206, respectively as shown in FIG. 2B. For the purposes of explanation, the VCO frequency, $f_c$, of carrier 208 is intentionally misaligned with the center frequency of the resonator, $f_c \neq f_{Res}$. The first pair of phase modulation sidebands 210 and 212 are located symmetrically about the carrier at frequencies $f_U = f_c + f_m$ and $f_L = f_c - f_m$, respectively.

The upper and lower sidebands 210 and 212, respectively, will be reflected from the reference resonator with different amplitudes and phases, since they are not symmetrically placed about the center of resonance, $f_{Res}$. The result will be that the reflected carrier is modulated in both phase and amplitude. Only in the special case of $f_c = f_{Res}$, will both the upper and lower sidebands 210 and 212 be reflected equally resulting in a reflected carrier with no amplitude modulation at frequency $f_m$. As will become apparent, the degree of amplitude modulation at frequency $f_m$, present on the reflected carrier signal, is an indication of the frequency error $f_c - f_{Res}$.

To understand the conversion from phase to amplitude modulation, consider phasor diagrams 300 and 302 shown in FIGS. 3A-3E. FIGS. 3A-C provide a simplified representation of phase modulation as shown in phasor diagram 300 of a phase modulated carrier 304 such as that impinging on the reference resonator. Phase modulation is represented by two phasors 306 and 308 that counter-rotate at rates of $\pm 2\pi f_m$ radians per second at the end of the carrier phasor. When the sideband phasors 306 and 308 align with the carrier 304 as shown in FIG. 3A, the phasors sum to zero. However, as shown in FIGS. 3B and 3C when the sideband phasors 306 and 308 do not align with the carrier 304 the incident lower and upper sidebands 310 and 312 add to the carrier 304 to advance and retard the carrier phase respectively. The result is a periodic variation of carrier phase at the modulation frequency, $f_m$, with no amplitude modulation. A careful consideration of FIGS. 3A-C shows that higher-order side bands are required to accurately describe pure phase modulation since that the length of the carrier phasor (amplitude) changes slightly at FIGS. 3B and 3C compared to 3A; but the simplification of ignoring higher-order side bands is sufficient to illustrate the process.

If the incident signal is a carrier 304 plus two equal amplitude sidebands 306 and 308 that add to zero as shown in FIG. 3A, the reflected sidebands 316 and 318 have different amplitudes and different phases as shown in FIG. 3D.

Consider a reflected signal 320 in which the side bands are altered in both amplitude 322 and phase 324 according to the frequency dependence of the resonator reflection coefficient. As shown in FIG. 3E (not to scale) the reflected upper side band 326 is reflected with much greater amplitude than the reflected lower sideband 328. Now it is no longer possible for the side bands to cancel in any orientation, and their summation follows a roughly elliptical locus 330. Thus, both the length and phase angle of the reflected carrier change significantly and there is both amplitude and phase modulation, at frequency $f_m$, of the reflected carrier whenever $f_c \neq f_{Res}$.

Furthermore, when the frequency error has the opposite sign, the relative changes in reflected sidebands 326 and 328 are swapped, and the lower side band 328 will dominate so that motion of the summation around the elliptical locus 330 is reversed. The phase of the amplitude modulation signal seen at the detector output will therefore reverse relative to the original modulating signal and the sign of the DC signal recovered by the synchronous detector also reverses and for frequency errors $f_c$-$f_{Res}$ less than the bandwidth of the resonator, the synchronous detector output is proportional to $f_c$-$f_{Res}$.

For an incident carrier having $f_c \approx f_{Res}$, the conversion of incident phase modulation sidebands to reflected amplitude modulation sidebands varies with modulation frequency $f_m$ in a manner proportional to $$\left[\left(\frac{dA}{df}\bigg|_{f_m}\right)^2 + \left(\frac{dP}{df}\bigg|_{f_m}\right)^2\right]^{1/2} \text{ where } \frac{dA}{df}\bigg|_{f_m}$$

is the slope of the resonator amplitude reflection coefficient, and $$\left(\frac{dP}{df}\bigg|_{f_m}\right)^2$$

is the slope of the phase reflection coefficient, at frequency $f_{Res}+f_m$. The conversion is therefore most efficient where the slopes of the curves 204 and 206 in FIG. 2B are high, that is where $f_m$ is small. The conversion factor varies relative to its maximum in a manner indicated by the dashed curve 214 in FIG. 2.

It should be understood that the width of the dip in the amplitude reflection coefficient 204, or alternatively, the peak in the phase to amplitude conversion 214, depends on the coupling coefficient of the resonator and it is not the transmission bandwidth of the resonance. If the coupling of the resonator is close to critical, the conversion from phase to amplitude modulation will be maximal and the optimal range for $f_m$ may be very much less than the resonator bandwidth. For example, in a critically coupled resonator with $f_{Res}$=10 GHz and a transmission bandwidth of 400 kHz, the width of the peak in conversion from phase to amplitude, as measured by a 3 dB change from the maximum, is less than 1 kHz.

Another embodiment of a frequency stabilized microwave source 400 is shown in FIG. 4 as a modification of the microwave source 100 shown in FIG. 1 with like numbers used to identify like elements. The phase shifter 116 is eliminated and the modulation source 124 is summed via a summing node 402 with Pound-servo voltage 112 into the VCO tuning port 114 to cause frequency modulation of the VCO 102. Frequency modulation and phase modulation being related simply by a factor of $1/j\omega$, the phase modulation of the carrier occurs with a 90° phase shift relative to the modulation source. However, this is easily accounted for in arranging the relative phases of the signals at synchronous detector 126.

Referring now to FIG. 5, a frequency stabilized microwave source 500 is arranged such that a reference resonator 502 also forms part of an oscillator loop 504 including a bandpass filter (BPF) 506 tuned to pass the resonant frequency $f_{Res}$ and a loop amplifier 510 so that a separate VCO is not required. FIG. 5, like FIG. 4, achieves the phase modulation of the signal incident on the reference resonator through frequency modulation.

Any phase change in oscillator loop 504 will cause a frequency change. Therefore, the frequency can be modulated by feeding a modulation signal 516 from a modulation source 518 to any phase shifter in oscillator loop 504. The Pound-servo feedback and the modulation signal can be applied to a common phase shifter or separate phase shifters. If a common phase shifter can provide the performance for both frequency modulation and tuning required by Pound-servo feedback it can be used. If the phase shift range over which the required accuracy is achieved for modulation is insufficient to accomplish the required tuning for the Pound-servo feedback than separate phase shifters may be required.

If a common phase shifter is used, the Pound-servo voltage 520 and modulation signal 516 are summed by summing node 522 and input to the common modulation phase shifter, either a loop phase shifter 508 before the loop amplifier 510 or a modulation phase shifter 524 after the loop amplifier 510. The other phase shifter is eliminated in this configuration. It may be preferable to position the common phase shifter before the loop amplifier 510 in order to use the full amplifier output power.

If separate phase shifters are used, the Pound-servo voltage 520 is input to loop phase shifter 508 and modulation signal 516 is input to modulation phase shifter 524. Summing node 522 is eliminated in this configuration. The positions of the phase shifters in the loop may be flipped and will be dictated by practical considerations such as can they handle the amplified output power.

The phase modulation induced through frequency modulation in signal 512 may lead to amplitude modulation in a reflected signal 530 directed by a circulator 532 to an amplitude detector 534. Any such amplitude modulation will cause a fluctuating signal on the detector output; the fluctuation signal having the same modulation frequency $f_m$. A synchronous detector 536 converts the fluctuation in amplitude detector output at modulation frequency $f_m$ into a DC frequency error voltage 538 representing the magnitude of the fluctuation. This DC voltage is then amplified and preferably integrated 540 to produce the Pound-servo voltage 520 that is either fed to summing node 522 or directly to loop phase shifter 508.

As shown in FIG. 5, a frequency-stabilized output signal 542 is taken from a different output 544 positioned after the reference resonator 502 in the oscillator loop 504, which typically results in reduced noise in the oscillator output due to the filtering action of the reference resonator 502. However, the output might equally well be taken from before the reference resonator as in FIGS. 1 and 4 without otherwise affecting the function of the microwave source.

SUMMARY

The following is a summary that provides a basic understanding of some aspects of the disclosure. This summary is not intended to identify key or critical elements of the disclosure or to delineate the scope of the disclosure. Its sole purpose is to present some concepts of the disclosure in a simplified form as a prelude to the more detailed description and the defining claims that are presented later.

The present disclosure describes the use of an IQ mixer in the Pound-servo loop to detect amplitude modulation of the signal reflected from the reference resonator. By properly configuring the IQ mixer so that the LO and RF inputs are maintained in quadrature at the Q mixer, hence in-phase at the I mixer, lower levels of amplitude modulation may be detected at lower modulation frequencies compatible with optimal choices of resonator coupling and maximal phase to amplitude conversion. With the Q mixer in quadrature, the Q mixer can be utilized as a wideband phase noise detector that is summed with the Pound-servo loop to achieve wideband phase noise suppression in addition to center frequency stabilization.

In a frequency-stabilized microwave source that uses Pound-stabilization or Pound-servo techniques to stabilize the oscillation frequency, the amplitude detector is implemented as an IQ mixer in which the signal reflected from the reference resonator provides the RF input and the I output produces a demodulated signal at modulation frequency fm representative of the amplitude modulation (AM) of the reflected carrier. The demodulated signal is applied to the synchronous detector. A phase error voltage indicative of a phase difference between the incident and reflected carriers provided at the Q output is integrated and fed back to a LO phase shifter where it is combined with a portion of the signal impinging on the resonator to produce a signal at the LO input such that the LO and RF inputs are maintained in quadrature at the Q mixer, hence in-phase at the I mixer. As a result, the synchronous detector produces a frequency error voltage proportional to the frequency error $f_c - f_{Res}$. With the LO and RF inputs held in quadrature at the Q mixer, the Q mixer serves as a phase perturbation detector. A portion of the Q mixer output is bandpass filtered and summed with the integrated frequency error voltage (the Pound-servo voltage). This combined voltage is applied to the tuning port of the oscillator to provide noise cancellation to both the center frequency error/close-in phase noise and the wideband phase noise. The frequency error is corrected by the Pound-servo and the wideband phase noise is suppressed by the Q mixer output.

In order to suppress the wideband phase noise without degrading the close-in phase noise, the BPF is preferably characterized by a low frequency cutoff $f_{cLow} > f_m$ designed to minimize muting (e.g., reduction or suppression) of the modulation signal, a high frequency cutoff $f_{cHigh}$ designed to allow gain margin >0 dB and phase margin >0 deg for closed-loop stability and sufficient gain within the passband to reach the noise floor of the IQ mixer.

The IQ mixer so configured can be used as the AM and PM detector in any frequency-stabilized microwave source that utilizes Pound-stabilization or Pound-servo techniques. For example, those techniques may utilize a reference resonator as the frequency-determining element within an oscillator loop and modulate the phase of the signal incident on the resonator by applying a modulation signal to a phase shifter at any point in the oscillator loop. One or more phase shifters may be provided in the oscillator loop so that the modulation signal may be combined with or separate from the Pound-servo feedback signal. Furthermore, those techniques may include configurations in which the reference resonator is separate to a VCO that generates a microwave signal and the phase modulation is achieved by means of a phase shifter between the VCO output and reference resonator or by combining the modulation signal with the Pound-servo feedback signal applied to tune the VCO.

In an embodiment, a quadrature compensation voltage may be summed with the phase error voltage at the Q output at the input to the integrator to compensate for non-idealities in the quadrature phase shift between the LO signals at the individual I and Q mixers. When LO phase compensation is used, the Q mixer broadband noise suppression signal should be sampled prior to the compensation injection so that changes in the compensation voltage are not injected into the noise suppression voltage.

These and other features and advantages of the disclosure will be apparent to those skilled in the art from the following detailed description of preferred embodiments, taken together with the accompanying drawings, in which:

BRIEF DESCRIPTION OF THE DRAWINGS

FIGS. 3A-3E, as described above, are phasor diagrams illustrating the conversion from phase to amplitude modulation;

DETAILED DESCRIPTION

The present disclosure describes the use of an IQ mixer instead of a simple diode in the Pound-servo loop to detect amplitude modulation of the signal reflected from the reference resonator. By properly configuring the IQ mixer so that the LO and RF inputs are maintained in quadrature at the Q mixer, lower levels of amplitude modulation may be detected at lower modulation frequencies compatible with optimal choices of resonator coupling and maximal phase to amplitude conversion. With the Q mixer in quadrature, the Q mixer can be utilized as a wideband phase noise detector that is summed with the Pound-servo loop to achieve wideband phase noise suppression in addition to center frequency stabilization.

Figure 1:
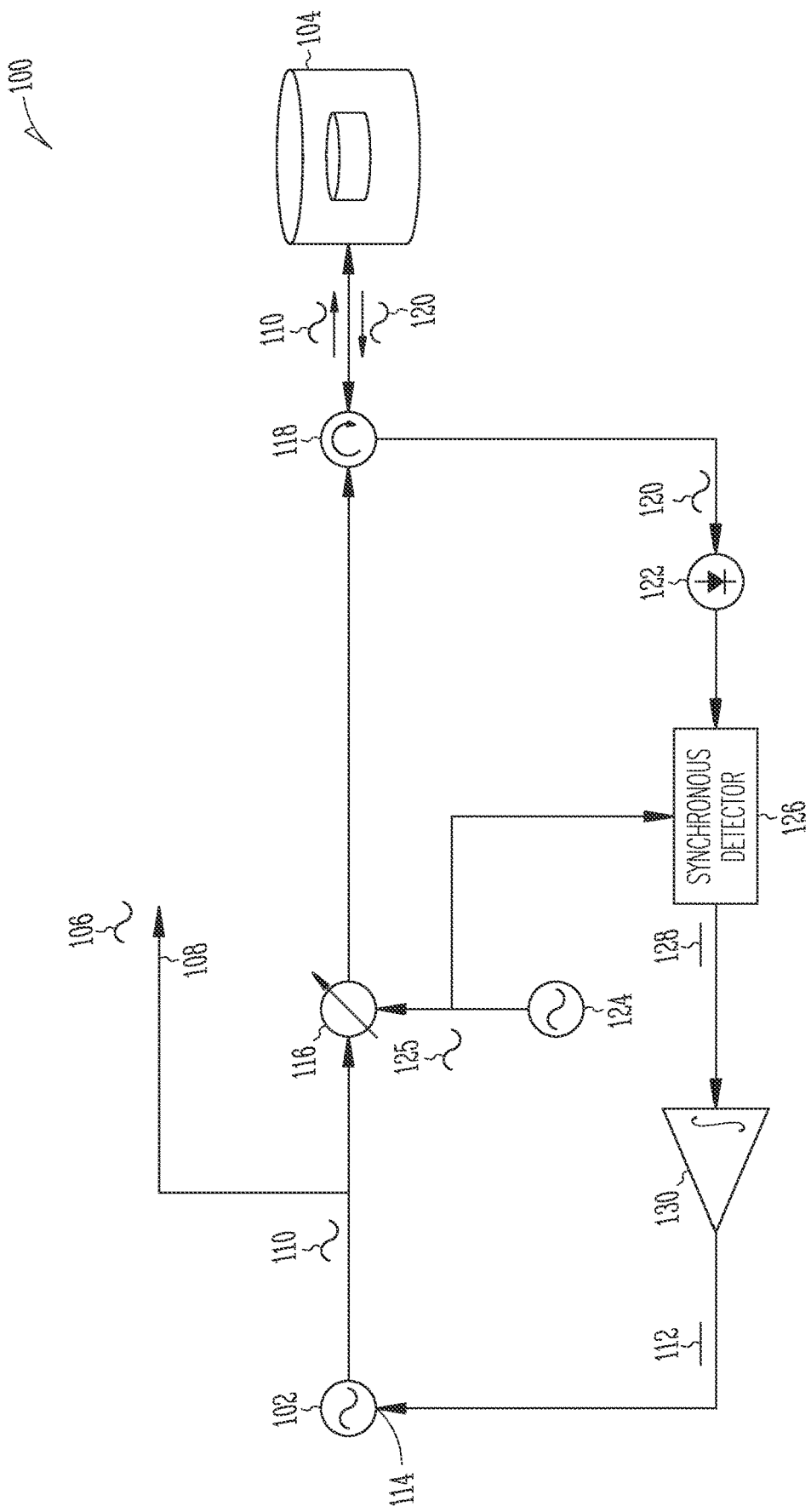
FIG. 1, as described above, is a known configuration of a frequency stabilized microwave source in which Pound-stabilization is used to stabilize an oscillator against an independent reference resonator.
Figure 2A:
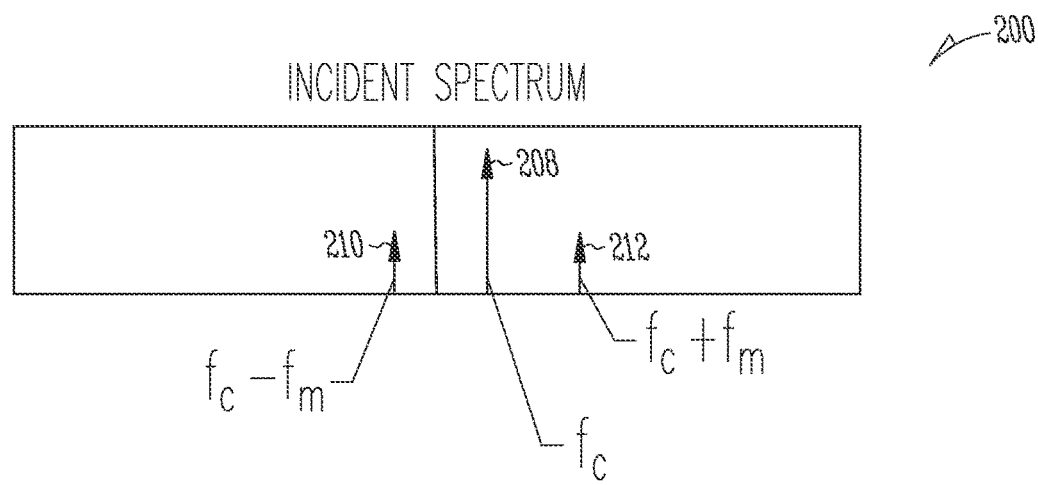
FIGS. 2A-2B, as described above, are plot of the incident and reflected spectra from the reference resonator.
Figure 2B:
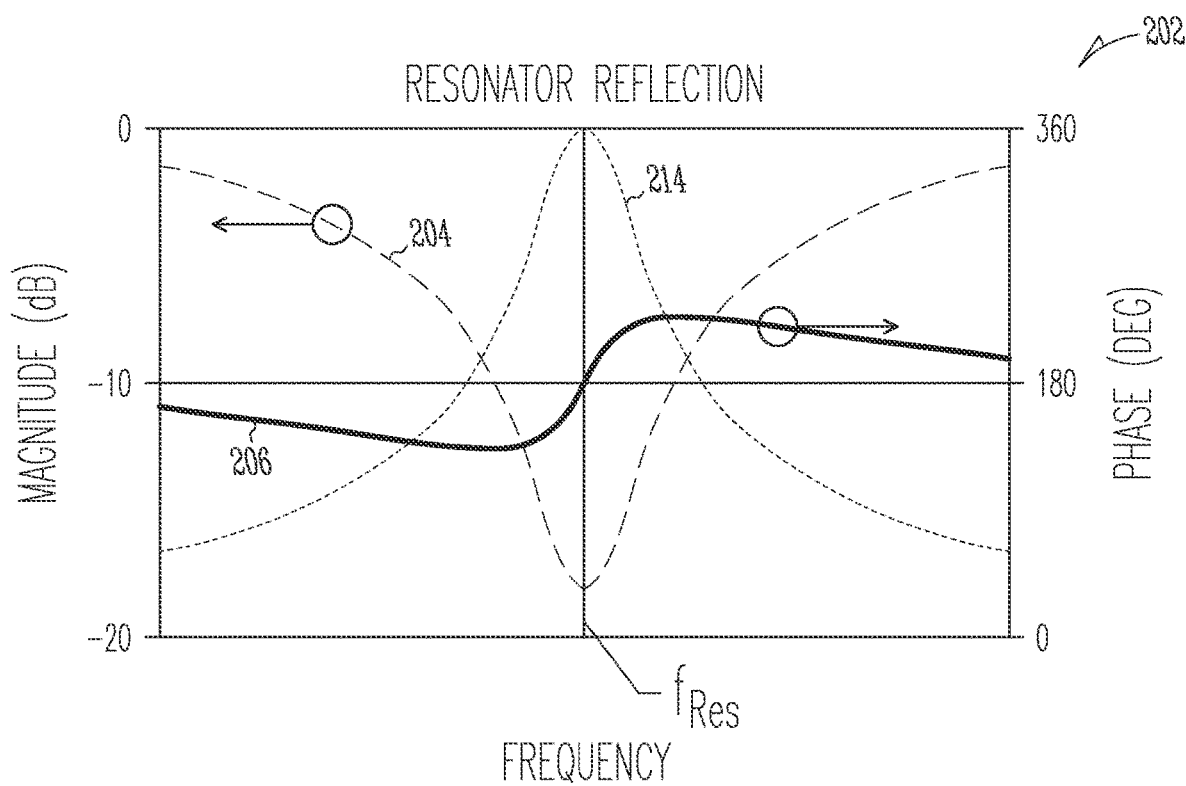

In a frequency-stabilized microwave source using Pound-stabilization or Pound-servo techniques, a diode detector is a very simple and low-cost way of recovering the amplitude modulation in the reflected signal of the reference resonator. However, when choosing a detector, the signal to noise ratio (SNR) needs to be considered. Diodes are non-linear devices where the conversion ratio, that is the signal voltage produced for a given change in input amplitude—sometimes written in mv/dB, depends upon the amplitude of the input carrier as well as the load resistance seen by the diode as shown in FIG. 1 of Serge Grop and Enrico Rubiola "Flicker Noise of Microwave Power Detectors", 2009 IEEE International Frequency Control Symposium Joint with the 22nd European Frequency and Time forum, 2009, pp. 40-43. Diode detectors also produce noise which will limit the smallest detectable signal, the noise having both a flicker, or 1/f, component dependent on the incident carrier power and a white floor often set by the load resistance.

Inherent within a synchronous detector is a low pass filter (LPF) element so that the synchronous detector is sensitive to only a bandwidth of frequencies about the modulation frequency $f_m$. Thus, an advantage in the Pound stabilization scheme is that only the noise power within the bandwidth of the synchronous detector about $f_m$, contributes to noise at the diode detector output. Thus, for a diode detector with noise 600 such as that shown by the dashed line in FIG. 6, it would be appropriate to select $f_m$ greater than about 10 kHz to achieve the lowest detector noise.

When choosing a diode detector, the designer must also consider the amount of power present at the diode detector which results from the power incident on the resonator and the resonator reflection coefficient which results from the resonator coupling coefficient β. If very low power is reflected onto the diode, as will be the case if the resonator is critically coupled, the diode conversion ratio will be low and if a high load resistor is chosen to improve the conversion ratio, the resistor will contribute higher thermal noise. Alternatively, if the resonator coupling is set to a less optimal value, so that higher power hits the diode, the conversion ratio may be higher, and a lower load resistor may be used. However, as the power incident on the diode increases, the flicker, or 1/f, noise increases so that it may become necessary to increase the modulation frequency, $f_m$, to improve signal to noise ratio. Thus, use of a diode detector dictates less than the optimal choices dictated by maximizing the phase to amplitude conversion, that is close to critical coupling at the resonator and small $f_m$ as discussed previously.

Mixers may be used as phase detectors at microwave frequencies by arranging for input LO and RF signals to be in quadrature (90° relative phase), see for example Stephan R. Kurtz, "Mixers as Phase Detectors" Tech-note, Watkins-Johnson Company Vol. 5 No. 1 January/February 1978. Conversely, if the input LO and RF signals are in phase (0° relative phase), the mixer is responsive to amplitude modulation of the RF signal. At intermediate phase angles between LO and RF a mixer will be sensitive to both phase and amplitude modulation, the relative sensitivities varying as the tangent of the phase angle. Since a mixer may be arranged to detect amplitude modulation it may also be considered as an alternative to a diode detector.

Figure 6A:
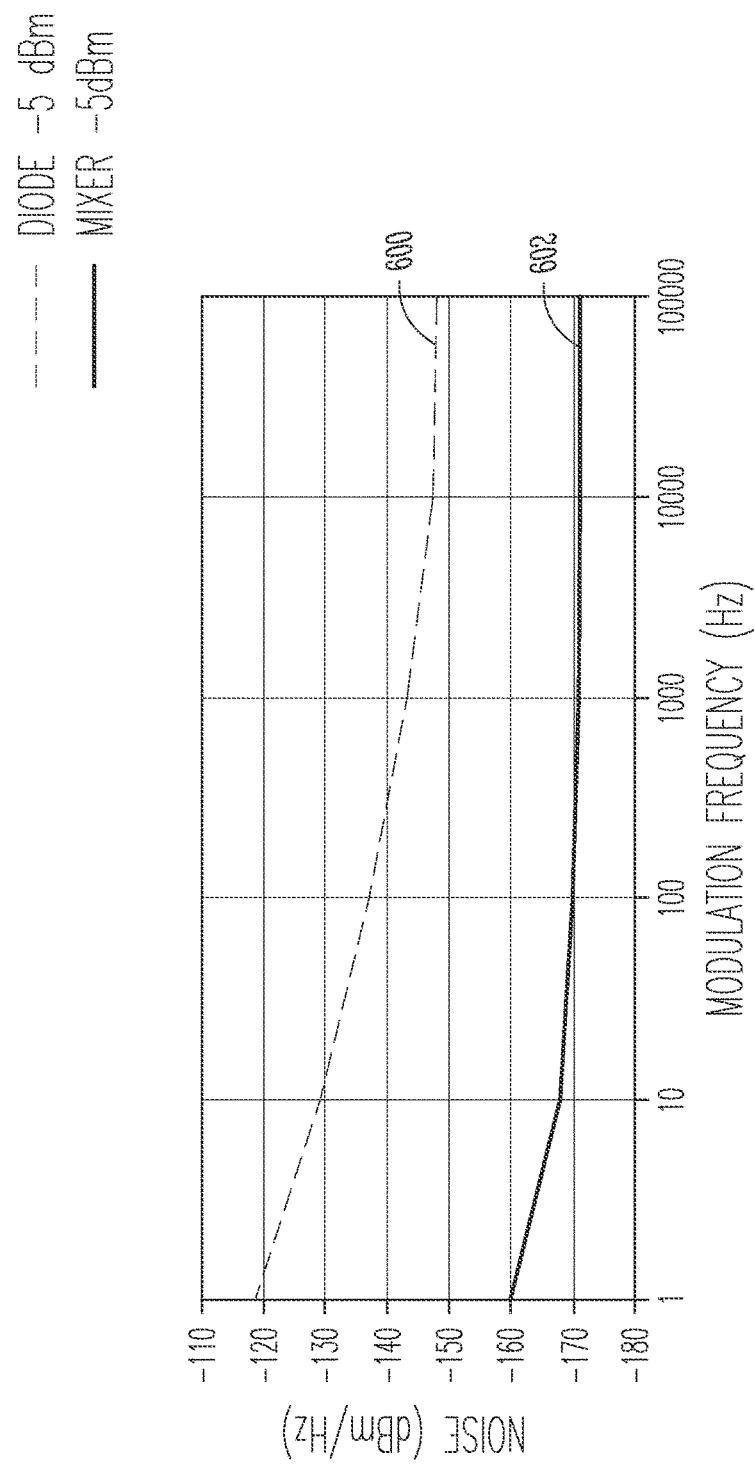
FIGS. 6a and 6b are a plot of noise floors for a diode and a mixer as AM detectors and a single side-band phase noise plot of oscillator phase noise comparing the free-running, pound-stabilized with IQ mixer, and pound-stabilized with IQ mixer+phase noise suppressed configurations, respectively.

Given the wide variability of devices and operating conditions it is always possible to find exceptions to sweeping comparisons of the relative performance of diodes and mixers as AM detectors. Generally, conversion ratios for diodes and mixers are similar, but mixer noise levels can be significantly lower. FIG. 6a shows examples of the noise power (noise floor) 600 and 602 for diode and mixer detectors, respectively, in a typical microwave AM detection application. The diode noise floor has been reported, for example, in the Grop and Rubiola paper. The mixer noise floor has been reported in C.A. Barnes et. al., "Residual PM Noise Evaluation of Radio Frequency Mixers" 2011 Joint Conference of the IEEE International Frequency Control and the European Frequency and Time Forum (FCS) Proceedings, 2011, pp 1-5.

The lower noise power that can be achieved using a mixer as shown by the solid line 602 in FIG. 6a offers a significant advantage. As is evident from FIG. 6, modulation frequency $f_m$ need only be greater than about 100 Hz to reach the minimum mixer noise, compared to the previously mentioned 10 kHz for the diode. This is compatible with an optimal choice for maximal phase to amplitude conversion.

While these advantages are evident, the in-phase relationship between the LO and RF signals at the I mixer must be maintained at a constant value close to 0° to minimize the detection of the phase modulation in the reflected signal. If the in-phase relationship is not maintained, then contamination of the amplitude detection by unwanted detection of attendant phase modulation may negate the advantage of lower noise power compared to that of the diode detector. The phase difference between the LO and RF signals will drift over time and temperature, which means the degree of contamination by phase modulation and the consequent frequency error drifts.

Figure 6B:
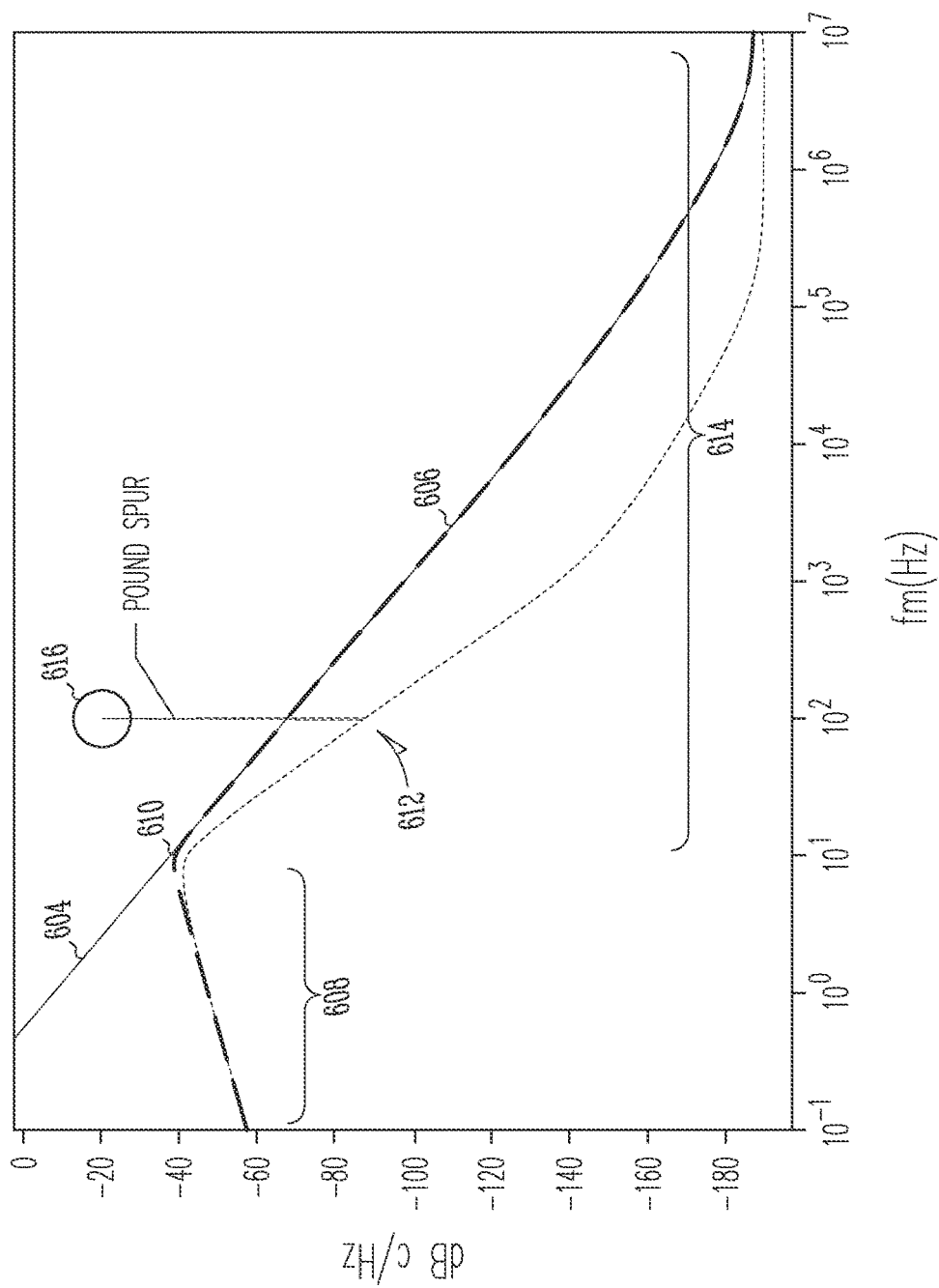

FIG. 6b is a single side-band phase noise plot of a representative example of the resulting oscillator phase noise for three different configurations. The free running oscillator configuration is represented by trace 604 and does not have Pound-stabilization nor phase noise suppression enabled. Trace 606 shows the phase noise when Pound-stabilization with the IQ mixer is enabled. The integrated center frequency error correction provided by the Pound-stabilization network with the IQ mixer results in an effective suppression of close-in phase noise 608 to the left of cross-over frequency $f_{cross-over}$ 610, the frequency at which the closed loop gain of the Pound-servo crosses through 0 dB. Modulation frequency $f_m$ must be outside the bandwidth of the Pound-servo (i.e., $f_m > f_{cross-over}$). If a trace for a Pound-stabilization network with a diode AM detector were shown, the close-in phase noise would be higher (less suppressed). Trace 612 shows the phase noise when both Pound-stabilization with the IQ mixer and wideband phase noise suppression are enabled. Wideband phase noise 614, to the right of cross-over frequency 610, is reduced when enabled. Trace 616 shows a pound spur at the modulation frequency $f_m$ due to the introduction of the modulation signal. The low frequency end of the Q-channel wideband phase noise suppression network is rolled off to prevent muting of the desired Pound-stabilization modulation tone and degradation of the Pound-stabilization's superior close-in phase noise performance. As illustrated, the close-in phase noise 608 lies between the carrier frequency fc (0 Hz on the X-axis) and cross-over frequency 610 and the wide-band phase noise 614 lies above the cross-over frequency 610. In this example, $f_m$=100 Hz and $f_{cross-over}$=10 Hz. The BPF that implements the wideband phase noise suppression has a low frequency cutoff $f_{cLow} > f_m$ designed to minimize muting of the modulation signal a high frequency cutoff $f_{cHigh}$ designed to allow gain margin >0 dB and phase margin >0 deg for closed-loop stability and sufficient gain to reach the noise floor 602 of the IQ mixer. In this example, $f_{cLow}$ is approximately 1 kHz and $f_{cHigh}$ is approximately 10 MHz.

Figure 7:
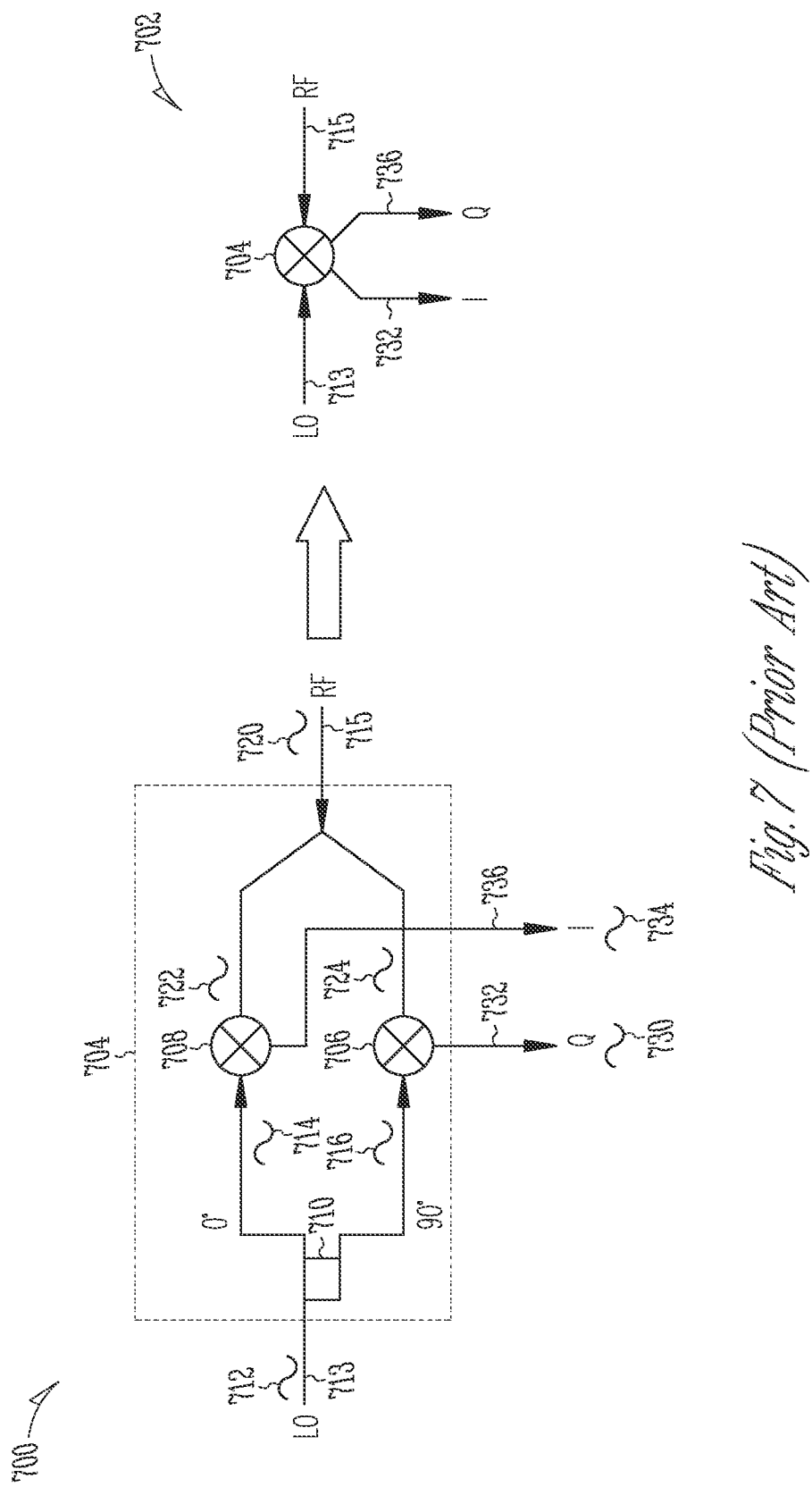
FIG. 7 is a schematic diagram and symbolic representation of an IQ mixer.

FIG. 7 is a schematic diagram 700 and symbol 702 of a circuit referred to as an IQ mixer 704. IQ mixer 704 includes a pair of conventional mixers; an I mixer 706 and a Q mixer 708, and a circuit element 710 for providing a fixed 90° phase shift between the LO signals at each mixer. Circuit element 710 is commonly a microwave transmission line structure or power splitter such as a branch-line coupler, also known as a quadrature hybrid, which splits the incoming common LO signal 712 at LO input port 713 into two equal signals 714 and 716 having relative phases 90° apart. An input RF signal 720 at RF input port 715 is also split by a microwave power splitter 717 into equal components 722 and 724, each component being fed to one of the mixers in the IQ arrangement. Note, equivalently the 90° shift may be imparted on the RF inputs instead of the LO inputs. Depending on the phase relationship between the LO and RF signals applied to the arrangement, if the lower mixer in FIG. 7 is sensitive to phase modulation (PM) then it would be identified as the "Q", (quadrature) mixer 708, while the upper mixer is the "I" (in phase), or AM sensitive mixer 706. Q mixer 708 produces a down-converted Q signal 730 at its Intermediate Frequency (IF) port 732 and I mixer 706 produces a down-converted I output 734 at its IF port 736. IQ mixers for operation at microwave frequencies are readily available as integrated circuits housed in a single package. These devices therefore provide a means of measuring both AM and PM signal modulations simultaneously wherein only one phase adjustment between the common LO and RF signals is required. For convenience an IQ mixer can be represented by the simpler schematic symbol 702 shown on the right in FIG. 7.

This disclosure relates to the method by which the amplitude modulation of the reflected signal is detected; and it may be applied in any implementation of frequency-stabilized microwave source using Pound-stabilization or Pound-servo techniques. This disclosure replaces the diode detector with an IQ mixer (specially configured) in order to achieve lower AM detection noise floor at lower modulation frequencies. The IQ mixer so configured addresses and mitigates any phase drift over time and temperature, hence any drift in phase modulation contamination.

Frequency-stabilized microwave sources that use Pound-stabilization or Pound-servo techniques include an oscillator loop that provides gain >1 and a phase shift of a multiple of 2pi, a modulation source configured to modulate a microwave carrier signal at carrier frequency $f_c$ at modulation frequency $f_m$ with upper and lower sidebands, a reference resonator, having a resonant frequency $f_{Res}$, to reflect a portion of the microwave signal, and a Pound-servo loop to detect differences between the carrier and resonant frequencies via AM of the reflected signal at the modulation frequency $f_m$ and feedback an error signal to drive the carrier frequency to the resonant frequency to thereby stabilize the carrier signal at the resonator frequency. As described previously, in different configurations the modulation can be performed directly in the phase domain or indirectly in the frequency domain. Furthermore, in different configurations oscillation may be provided by an arrangement wherein the resonator is separate to a VCO or an arrangement where the reference resonator is included within an oscillating loop. The present disclosure uses an IQ mixer in the Pound-servo loop to detect amplitude modulation of the signal reflected from the reference resonator.

Figure 8:
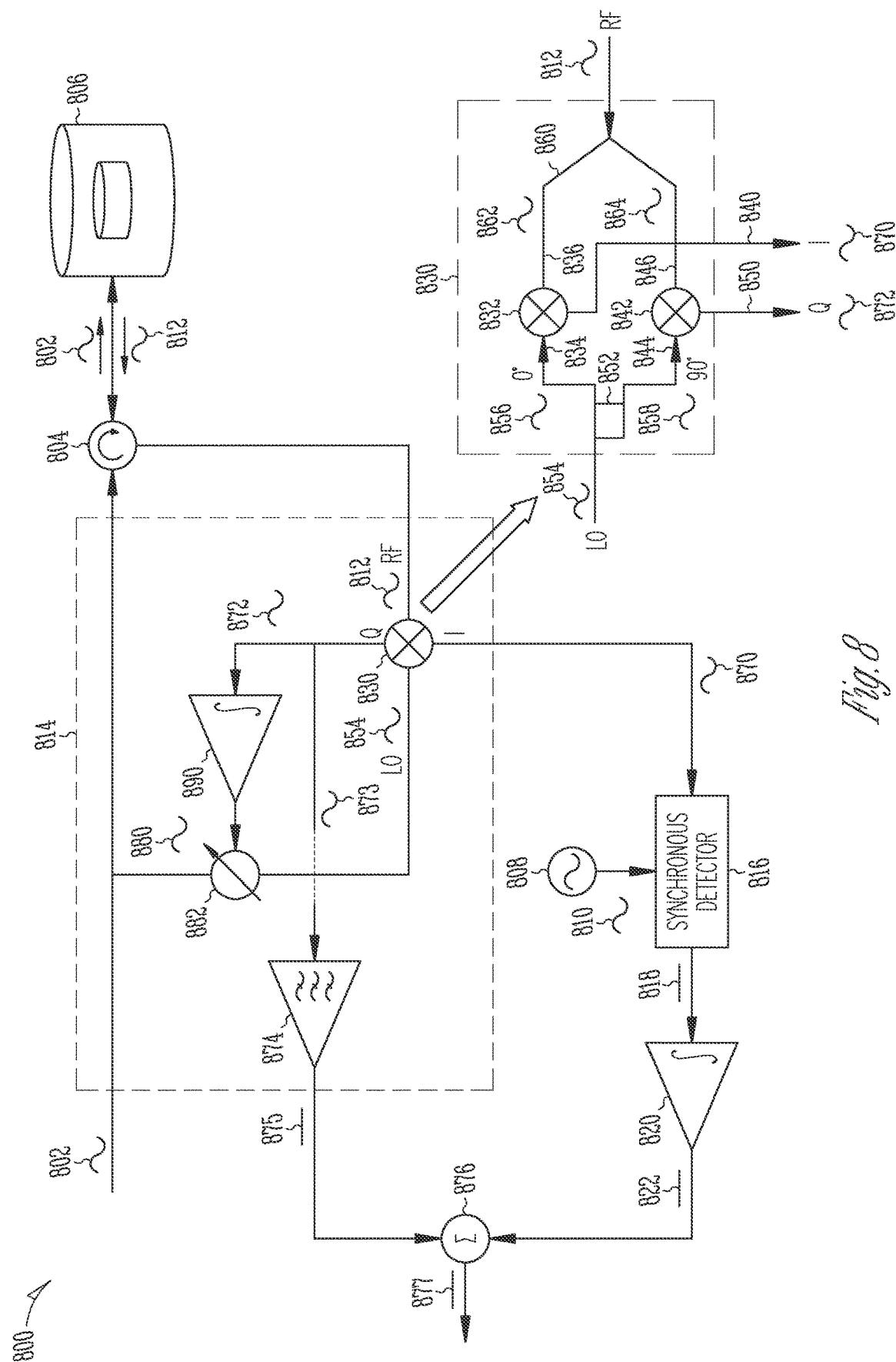
FIG. 8 is a schematic diagram of a core portion of a Pound-stabilized microwave source that includes an IQ mixer configured to perform the amplitude modulated detection.

Referring now to FIG. 8, any such Pound-stabilized microwave sources in accordance with the present disclosure include a core circuit 800 in which a microwave signal 802 passes through a circulator 804 and is reflected off a reference resonator 806. A modulation source 808 generates a modulation signal 810 at modulation frequency $f_m$ to apply phase modulation, either directly or indirectly through frequency modulation, to microwave signal 802 impinging on the resonator. The degree of amplitude modulation at frequency $f_m$, present on the reflected carrier signal, is an indication of the frequency error $f_c$-$f_{Res}$ between the carrier frequency $f_c$ and the resonator frequency $f_{Res}$. The reflected signal 812 is re-directed by circulator 804 to an AM detector 814. A synchronous detector 816 converts the fluctuation in amplitude detector output at modulation frequency $f_m$ into a DC frequency error voltage 818 representing the magnitude of the fluctuation. This DC voltage is then amplified and preferably integrated via integrator 820 to provide Pound-servo gain to produce Pound-servo voltage 822 that is fed back (to the tuning port of the VCO or into a phase shifter within an oscillator loop) to drive the carrier frequency $f_c$ to the resonator frequency $f_{Res}$.

In accordance with the disclosure, the AM detector 814 is implemented as an IQ mixer 830 to detect amplitude modulation (AM) in the reflected signal 812. This achieves the lower noise floor 602 associated with a mixer shown in FIG. 6 and thus facilitates the use of lower modulation frequencies $f_m$ (e.g., $f_m$ need only be greater than about 100 Hz to reach the minimum mixer noise), which is compatible with optimal choices of resonator coupling and maximal phase to amplitude conversion. Furthermore, feedback is provided from the output of the Q mixer to the LO input of the IQ mixer to hold the phase at the LO input to the Q mixer at approximately 90 degrees such that the phase at the LO input to the I mixer is approximately 0 degrees. This is also referred to as "maintaining the LO and RF inputs in quadrature at the Q mixer." This is critical to minimize the detection of any phase modulation in the reflected signal 812 such that the detected signal at the output of the I mixer is solely attributed to amplitude modulation in the reflected signal. If the LO input to the Q mixer is not maintained at 90 degrees, phase modulation in the reflected signal 812 will induce an error in the Pound-servo voltage 822.

IQ mixer 830 includes an I mixer 832 having LO and RF input ports 834 and 836, respectively, and an IF output port 840 and a Q mixer 842 having LO and RF input ports 844 and 846, respectively, and an IF output port 850. A microwave power splitter 852 splits a LO signal 854 into first and second LO signals 856 and 858, respectively, having relative phases 900 apart, that are applied to LO input ports 834 and 844, respectively. A microwave power splitter 860 splits the reflected signal 812 into first and second RF signals 862 and 864, respectively, having the same phase, that are applied to RF input ports 836 and 846, respectively. The I and Q mixers produce I and Q down-converted signals 870 and 872, respectively, at IF outputs ports 840 and 850, respectively.

In operation, a portion 880 of the signal 802 directed towards the reference resonator 806 is coupled off and sent via a local oscillator (LO) phase shifter 882 as LO signal 854 to the LO port of the IQ mixer. For the purposes of explanation, assume that the voltage applied to the LO Phase shifter 882 is at zero volts and that suitable transmission line path lengths, or other phase-shifting means such as combinations of lumped circuit elements, not shown in the figures, have been provided so that the LO and RF signals 854 and 812, respectively, arrive at the input ports to the IQ mixer with some small phase difference, $\Delta\varphi \neq 0$. Practical phase shifters will typically function with only one polarity of control voltage, but it is a simple matter to sum in an offset to meet this condition.

The I mixer 832 in this scenario, while being predominantly responsive to amplitude modulation of the reflected signal 812, also has a small sensitivity to phase modulation in the reflected signal so that the DC frequency error voltage 818 at the synchronous detector output can be considered as a summation of two component voltages, $V_{AM}$ and $V_{PH}$ resulting from amplitude and phase modulations of the reflected carrier. The phase modulation applied to the carrier and reflected from the resonator (still as phase modulation) will therefore result in a small $V_{PH}=V_{Error}$. In response to $V_{Error}$, the Pound-servo voltage 822 will adjust the frequency of the oscillator loop where the amplitude-to-phase conversion action of the resonator reflection produces sufficient amplitude modulation to provide $V_{AM}=-V_{Error}$ so that the synchronous detector output goes to zero volts and the oscillator loop remains at a frequency $f_c=f_{Res}+f_{Error}$.

Now, the small phase error, $\Delta\varphi$, may be considered as a "DC modulation" of the phase between LO and RF signals 858 and 864 at the input to the Q mixer 842. The down-converted Q signal 872, which is a phase error voltage, will therefore carry a DC signal, $V\varphi$, proportional to $\Delta\varphi$. It is important to note that $V\varphi$ results from the phase difference between the carriers (incident and reflected) at the mixer, not from the modulation side bands. The sidebands will produce a fluctuating signal at the Q output having frequency $f_m$.

If $V\varphi$ is amplified and fed back via a LPF or amplifying integrator 890 to the LO phase shifter 882 with the correct sign, then the phase error $\Delta\varphi$ will be reduced, simultaneously adjusting the Q mixer 842 towards pure phase sensitivity and the I mixer 832 towards pure amplitude sensitivity.

As the I mixer 832 loses phase sensitivity the voltage $V_{Error}$ diminishes with a consequence that the frequency error $f_{Error}$ in the Pound-servo is reduced.

The fluctuating signal at the Q output resulting from the phase modulation of the carrier is effectively removed from consideration by the low pass filtering action of the integrator (or LPF). It will be apparent that in the preceding discussion a simple low pass filter and amplifier between the Q output 850 and LO Phase shifter 882 would serve to produce a similar result. However, the infinite DC gain provided by an integrator will result in the phase error $\Delta\varphi$ diminishing to zero. The time constant of the integrator in the LO Phase feedback loop can be long since it only needs to compensate for relatively slow thermal or aging effects, and it is therefore highly effective at removing the modulation signal at $f_m$.

As a result, the down-converted I signal 870 includes a demodulation signal having frequency $f_m$. The demodulation signal has a magnitude and sign representative of the amplitude modulation of the reflected carrier. As such the synchronous detector produces frequency error voltage 818 proportional only to the frequency error $f_c-f_{Res}$, which in turn reduces the frequency error in the oscillator loop towards zero.

With the Q mixer held in quadrature by the aforementioned LO phase servo, the Q mixer 842 acts as a broadband oscillator phase noise detector based on the resonator's reflection characteristics. A portion 873 of the Q mixer output 872 is sampled and fed to a bandpass filter 874. The output of the bandpass filter is a broadband phase correction voltage 875 that is summed with the Pound-servo integrator frequency error voltage 822 at a summing junction 876. The combined voltage 877 possesses correction terms for both the center frequency error and the wideband phase noise and is applied to the tuning port of the oscillator. The bandpass filter's low frequency cutoff $f_{cLow}$ is designed to minimize muting of the desired Pound-modulation of modulation signal 810 such that $f_{cLow}>f_m$. Without sufficient low frequency roll-off, the BPF could degrade the close-in phase noise suppression. The bandpass filter's high frequency cutoff $f_{cHigh}$ is designed to allow gain margin >0 dB and phase margin >0 deg for closed-loop stability. The BPF 874 is configured to provide sufficient gain in the passband to reach the noise floor of the IQ mixer.

The discussion so far has assumed that the independent I and Q mixers within the IQ mixer are ideally responsive as if the phase difference between their LO signals was exactly 90° (quadrature). This ideal state may not be realized in practice and there will usually be some small quadrature error. As a result, even if the LO Phase shifter is adjusted so that Q mixer is perfectly phase sensitive, the I mixer will retain some slight sensitivity to phase modulation, resulting in a phase-modulation induced frequency error, $f_{PMError} \neq 0$, in the Pound-servo. Diode detectors are also slightly sensitive to phase modulation. Fundamentally, both a diode detector and an AM-sensitive mixer will have some low-pass bandwidth which is responsible for rejecting the carrier frequency $f_c$ at the detector output. The minimum detector bandwidth and therefore maximum rejection of $f_c$ is governed by the need to pass the modulation frequency $f_m$. Therefore, both diode and mixer amplitude detectors become subject to the same fundamental limit on rejection of the phase modulation signal and the same minimum $f_{PMError}$.

Figure 9:
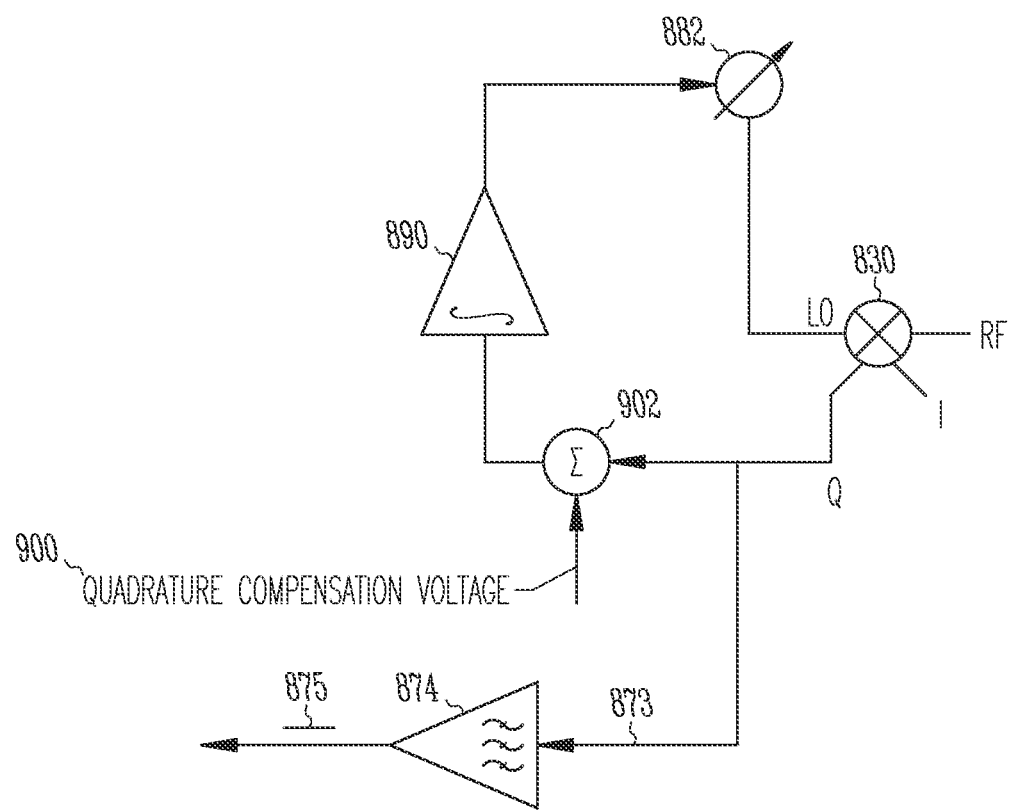
FIG. 9 is an alternate configuration of an IQ mixer to compensate for non-idealities in the individual I and Q mixers.

In the case of the arrangement described in FIG. 9, the realization of this fundamental limit may require compensation for any small quadrature error in the IQ mixer. This compensation is achieved by the addition of a small quadrature compensation voltage 900 via summing node 902 at the input to the integrator 890 as shown in FIG. 9. Since the sign of $f_{Error}$ resulting from a quadrature error in the IQ mixer 830 reverses as the quadrature error passes through zero, it is a simple matter to determine the magnitude of the required quadrature compensation voltage 900 by adjusting it to reduce sensitivity of the demodulation signal to phase modulation in the reflected signal. When LO phase compensation is used, the output of the Q mixer should be sampled to provide signal 873 prior to the compensation injection at summing node 902 so that changes in the compensation voltage 900 are not injected into the noise suppression voltage 875.

In any case, a requirement that the carrier frequency $f_c$ remains constant does not necessarily extend to requiring that $f_{PMError}=0$, only that, $f_{PMError}=$constant. The stability of $f_{PMError}$ is a separate consideration and does not detract from the ability of the mixer amplitude detector to detect a smaller frequency deviation in the Pound-servo loop because of its lower noise floor.

Thus, it is demonstrated that the disclosed technique maintains the correct phase relationship between the LO and RF signals at the IQ mixer such that the Q output is maintained maximally sensitive to amplitude modulation and minimally sensitive to phase modulation, thereby enabling practical use of a mixer instead of a diode as the detector in a Pound stabilization system and realization of the advantages of the mixer's lower noise floor.

Figure 4:
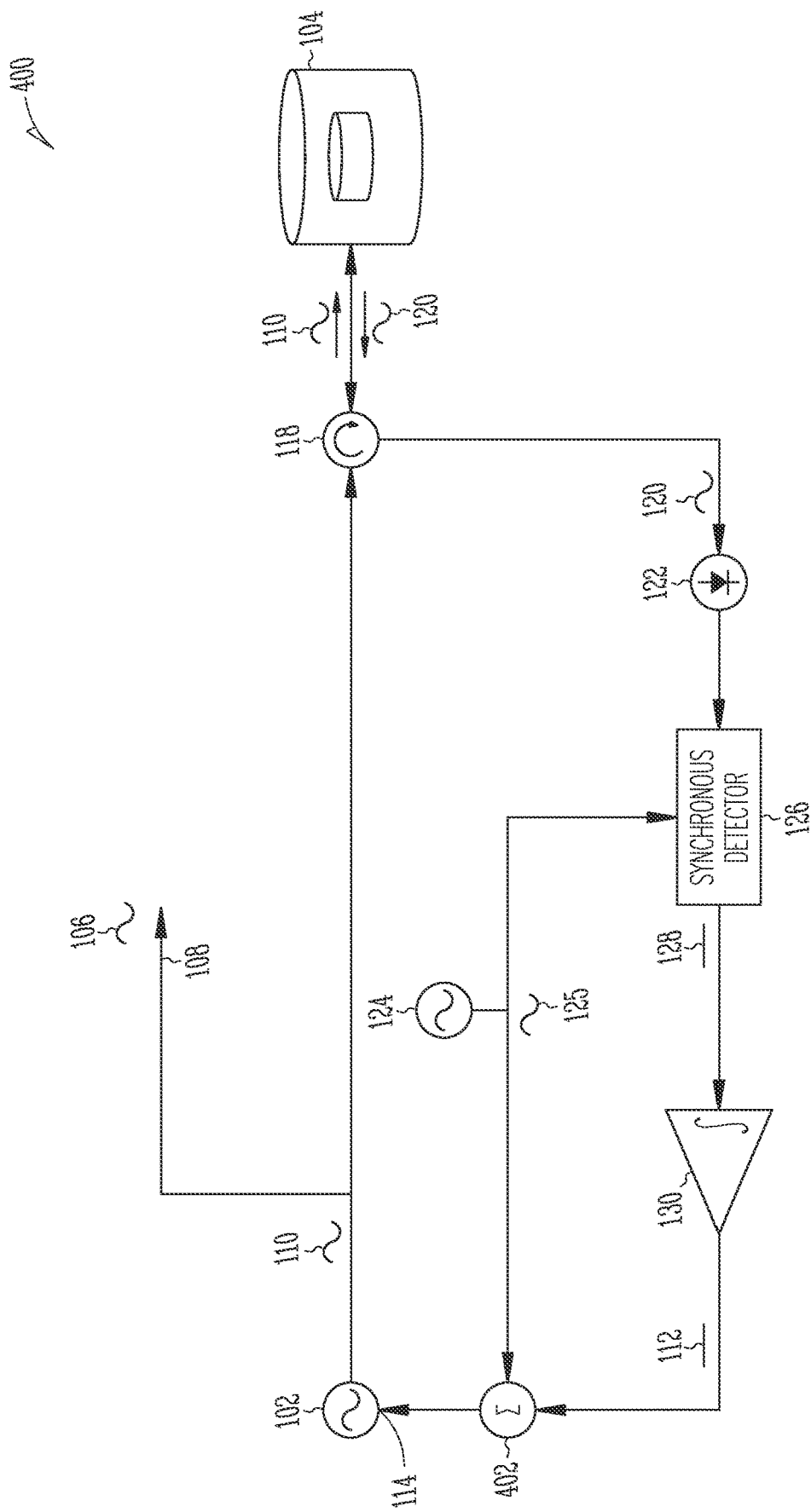
FIG. 4, as described above, is another known configuration of a frequency stabilized microwave source in which Pound-stabilization is used to stabilize an oscillator against an independent reference resonator.
Figure 5:
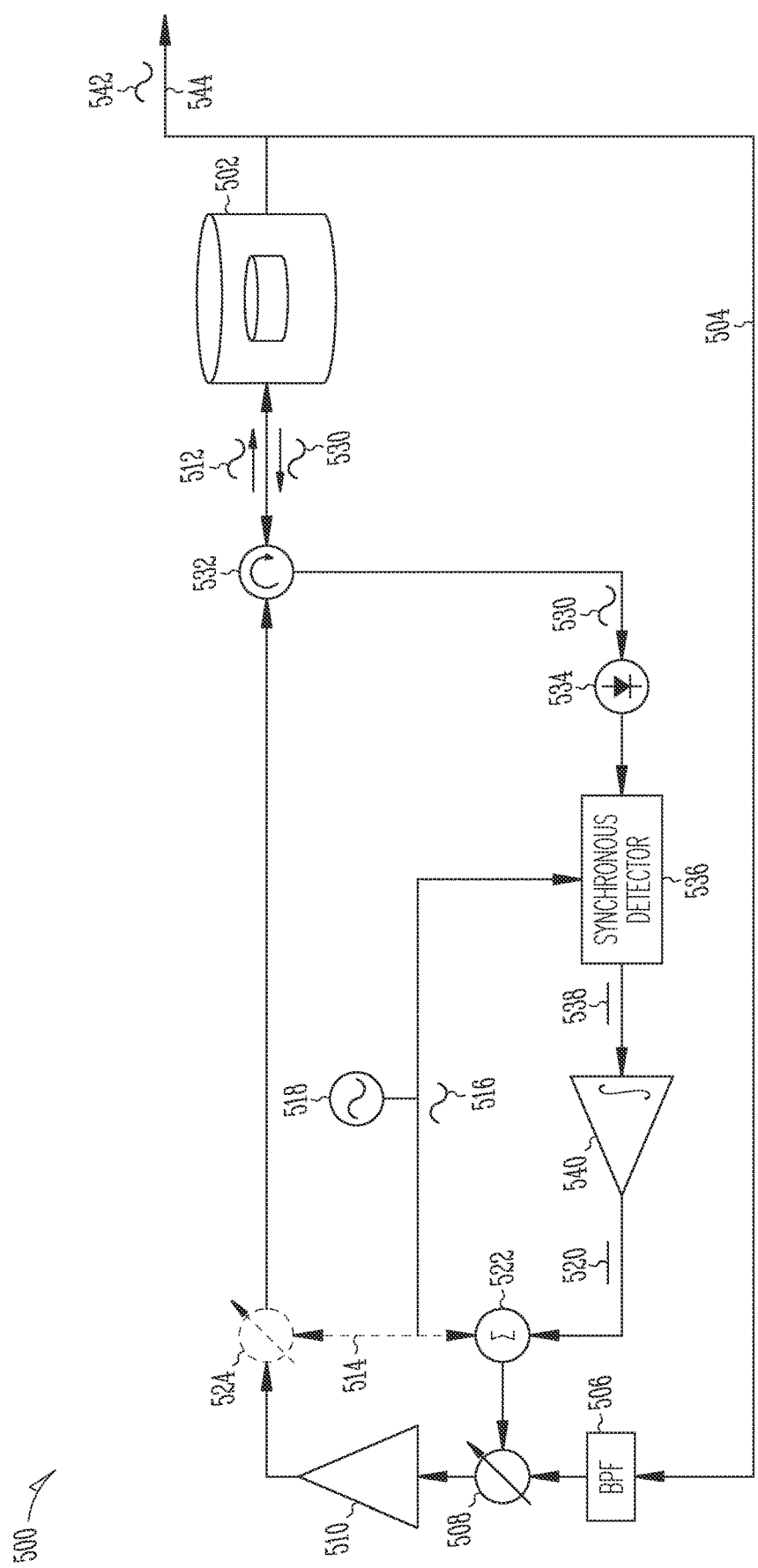
FIG. 5, as described above, is a known configuration of a frequency stabilized microwave source in which Pound-stabilization is implemented with a reference resonator that also forms part of an oscillator loop.
Figure 10:
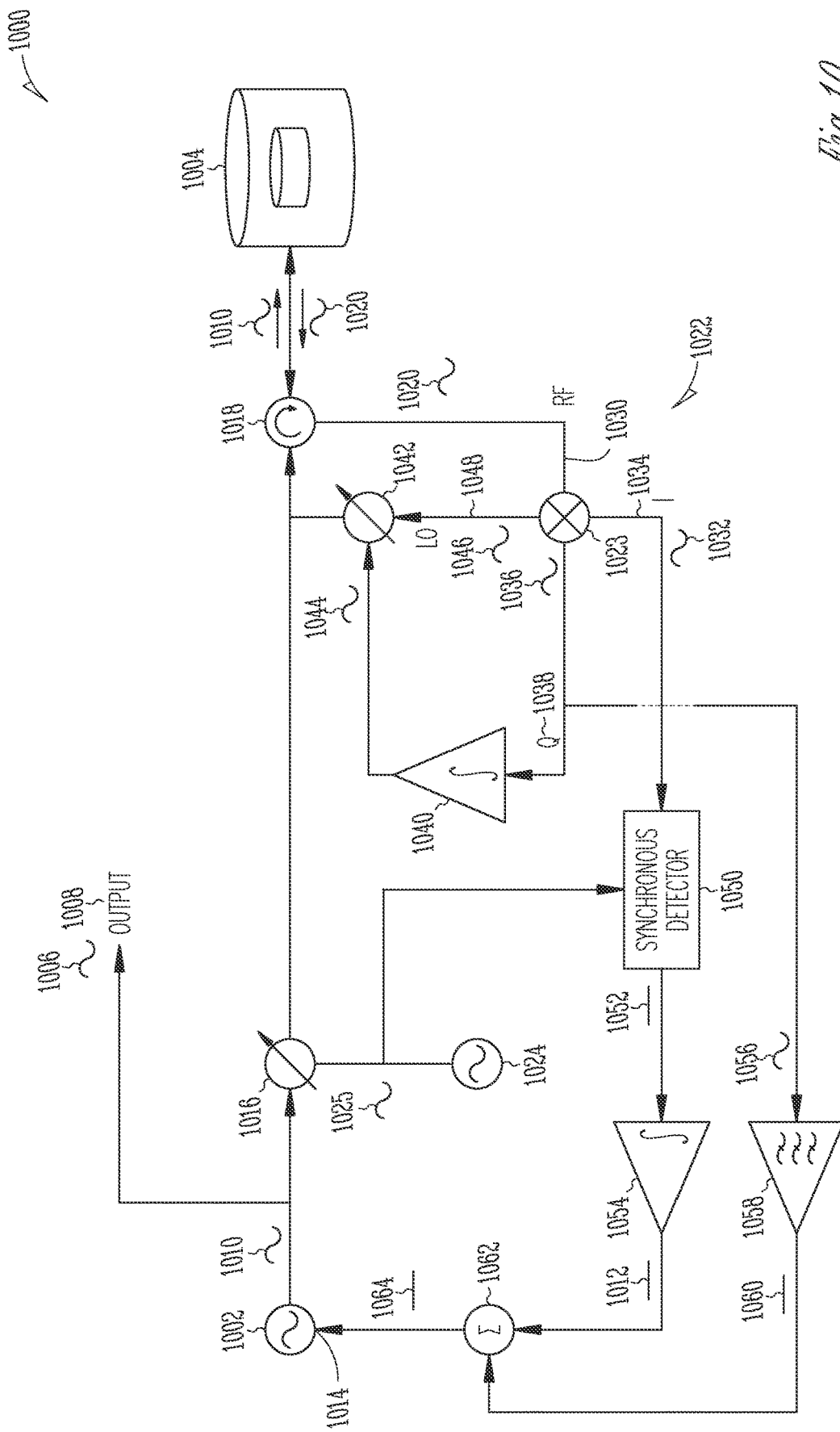
FIG. 10 is a first embodiment of a Pound-stabilized frequency stabilized microwave source in which an IQ mixer is configured to perform the AM detection.
Figure 11:
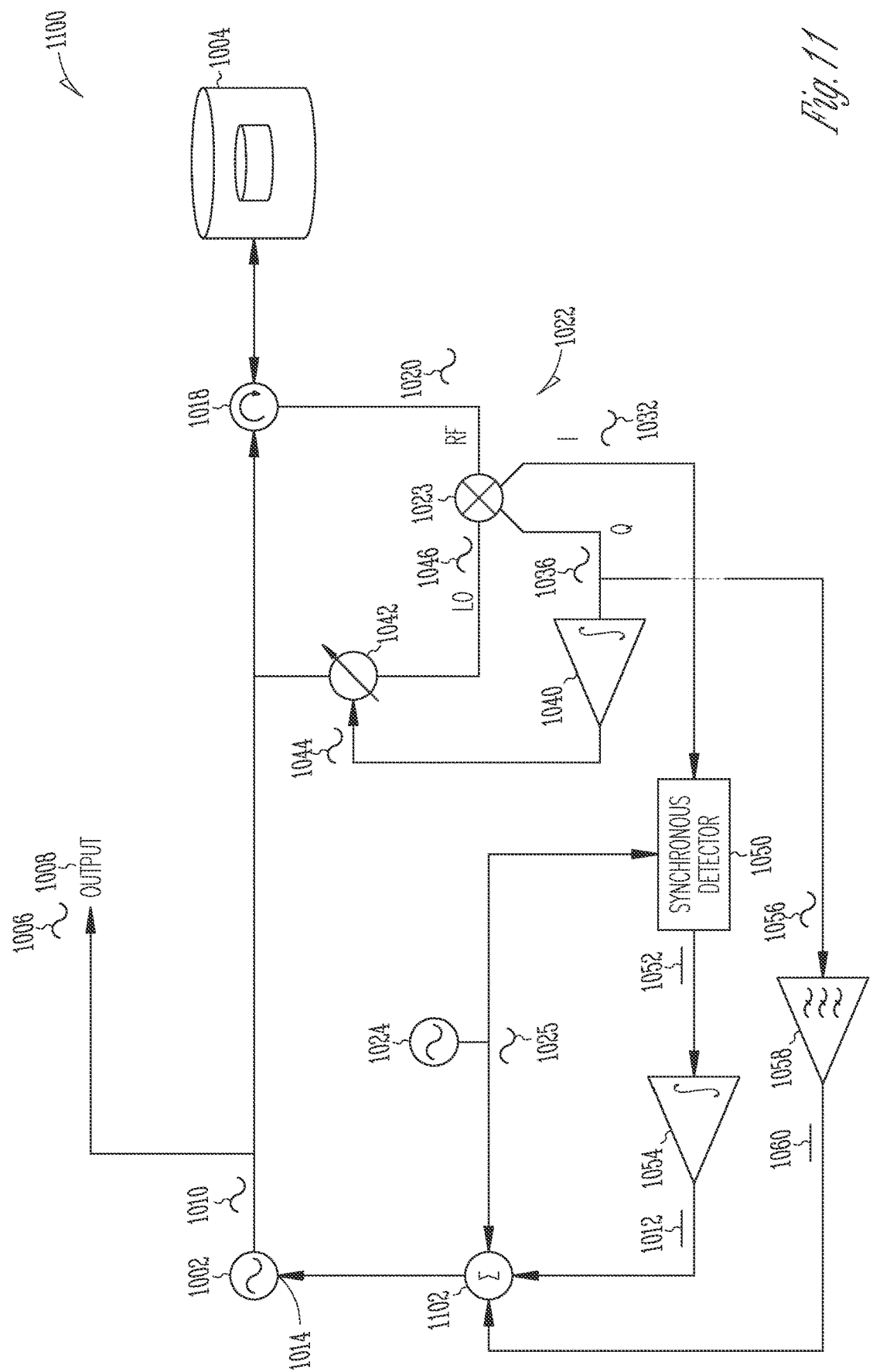
FIG. 11 is a second embodiment of a Pound-stabilized frequency stabilized microwave source in which an IQ mixer is configured to perform the AM detection.
Figure 12:
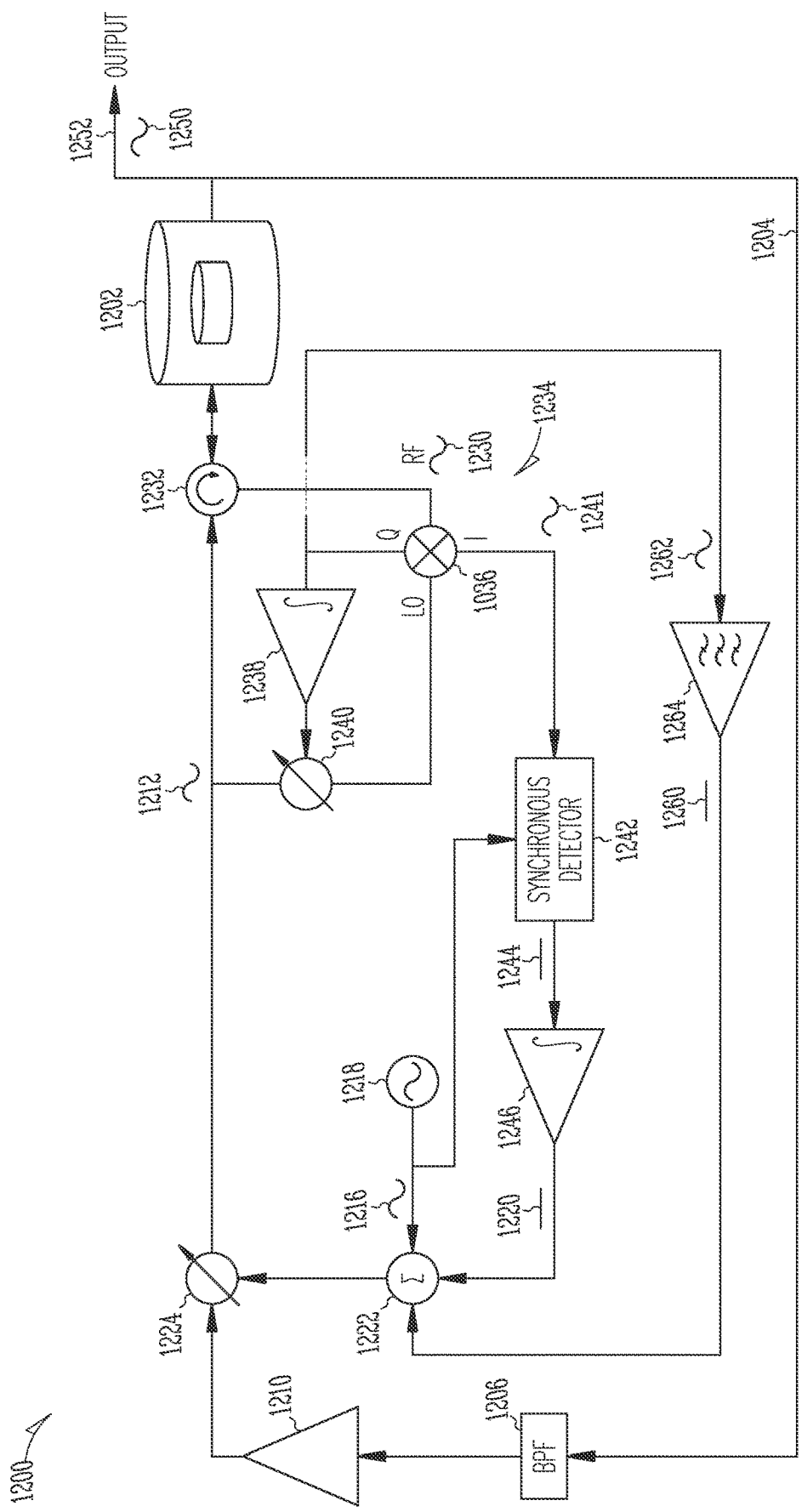
FIG. 12 is a first embodiment of a Pound-stabilized frequency stabilized microwave source in which an IQ mixer is configured to perform the AM detection.

As described, the IQ mixer can be implemented in any Pound-stabilized or Pound-servo frequency-stabilized microwave source. FIGS. 10-12 illustrate three of the known Pound-stabilized microwave source topologies illustrated in FIGS. 1, 4 and 5, respectively.

Referring now to FIG. 10, a frequency stabilized microwave source 1000 uses the Pound-stabilization technique to stabilize a microwave oscillator i.e., a VCO 1002 against a reference resonator 1004 separate to the VCO to generate a frequency-stabilized output signal 1006 at output port 1008. The VCO generates an output signal 1010, a portion of which is taken as frequency-stabilized output signal 1006. The signal frequency can be tuned by a Pound-servo voltage 1012 applied to the VCO's tuning port 1014. Output signal 1010 is passed through a phase shifter 1016 and a circulator 1018 before impinging on reference resonator 1004. The frequency of the VCO 1002 must be tunable to match the center frequency of the resonator, $f_{Res}$. Typically, the resonator may be a cavity resonator which may include a dielectric element, although the technique may be applied using any resonator with a suitable center frequency and stability.

A portion of the output signal 1010 impinging on the resonator will be reflected in accordance with well-known properties of resonators as reflected signal 1020. This reflected energy is directed by circulator 1018 onto an amplitude detector 1022 which is implemented as an I/Q mixer 1023. A modulation source 1024 generates a modulation signal 1025 at a modulation frequency, $f_m$ to apply phase modulation to output signal 1010 impinging on the resonator by way of the phase shifter 1016. The phase modulation may lead to amplitude modulation in the reflected signal 1020 seen by the amplitude detector 1022. Any such amplitude modulation will cause a fluctuating signal on the detector output, said fluctuation having the same modulation frequency $f_m$. IQ mixer 1023 is configured to minimize or eliminate any contribution to the demodulation signal 1032 caused by phase modulation in the reflected signal 1020.

IQ mixer 1023 receives reflected signal 1020 at its RF input 1030 and produces a demodulation signal 1032 at modulation frequency $f_m$ representative of the AM of the reflected carrier at its I output 1034. An LO phase shifter 1042 receives a portion 1044 of the signal 1010. A phase error voltage 1036 indicative of a phase difference between the incident and reflected carriers is provided at the mixer's Q output 1038, which is integrated 1040 and fed back to the LO phase shifter 1042 as an approximately DC signal where it modifies the effective phase shift through LO phase shifter 1042 to produce a signal 1046 at the mixer's LO input 1048 such that the LO and RF inputs are maintained in quadrature at the Q mixer, hence in-phase at the I mixer.

A synchronous detector 1050 converts demodulation signal 1032 into a DC frequency error voltage 1052 representing the magnitude of the fluctuation. By maintaining the inputs to the Q mixer in quadrature, the synchronous detector produces a frequency error voltage proportional only to any amplitude modulation of the reflected signal and thereby the frequency error $f_c-f_{Res}$, which in turn reduces the frequency error in the oscillator loop towards zero. This DC voltage is then amplified and preferably integrated via integrator 1054 to provide Pound-servo gain to produce Pound-servo voltage 1012. A sample 1056 of the Q mixer output 1036 is amplified and filtered by BPF 1058. The filtered output, broadband phase correction voltage 1060, is combined with the Pound-servo voltage 1012 at a summing junction 1062. The combined output of the summing junction 1062 is a combined close-in and broadband error signal 1064 that is fed to the tuning port 1014 of VCO 1002.

Another embodiment of a frequency stabilized microwave source 1100 is shown in FIG. 11 as a modification of the microwave source 1000 shown in FIG. 10 with like numbers used to identify like elements. The phase shifter 1016 is eliminated and the modulation source 1024 is summed via a summing node 1102 with Pound-servo voltage 1012 and broadband phase correction voltage 1060 into the VCO tuning port 1014 to cause frequency modulation of the VCO 1002. Frequency modulation and phase modulation being related simply by a factor of $1/j\omega$, the phase modulation of the carrier occurs with a 90° phase shift relative to the modulation source. However, this is easily accounted for in arranging the relative phases of the signals at synchronous detector 1050. The IQ mixer 1023 is configured and operates as previously described.

Referring now to FIG. 12, a frequency stabilized microwave source 1200 is arranged such that a reference resonator 1202 also forms part of an oscillator loop 1204 including a bandpass filter (BPF) 1206 tuned to pass the resonant frequency $f_{Res}$ and a loop amplifier 1210 so that a separate VCO is not required. FIG. 12, like FIG. 11, achieves the phase modulation of the signal incident on the reference resonator through frequency modulation.

Any phase change in oscillator loop 1204 will cause a frequency change. Therefore, the frequency can be modulated by feeding a modulation signal 1216 from a modulation source 1218 to any phase shifter in oscillator loop 1204. The Pound-servo feedback, phase noise suppression signal, and the modulation signal can be applied to a common phase shifter or separate phase shifters positioned anywhere in oscillator loop 1204. If a common phase shifter can provide the performance for both frequency modulation and tuning required by Pound-servo feedback it can be used. If the phase shift range over which the required accuracy is achieved for modulation is insufficient to accomplish the required tuning for the Pound-servo feedback than separate phase shifters may be required. As shown, a common phase shifter 1224 is positioned at the output of loop amplifier 1210. A Pound-servo voltage 1220, a broadband phase correction voltage 1260 and modulation signal 1216 are summed by summing node 1222 and input to the common phase shifter 1224.

The phase modulation induced through frequency modulation of signal 1212 may lead to amplitude modulation in a reflected signal 1230 directed by a circulator 1232 to an amplitude detector 1234 implemented as an IQ mixer 1236 in which the phase error voltage at the Q output is integrated 1238 and summed with a portion of signal 1212 by a LO phase shifter 1240 and feedback to the LO input to hold the LO and RF inputs of the Q mixer in quadrature. Any such amplitude modulation will cause a fluctuating signal on the detector output; the fluctuating signal having the same modulation frequency $f_m$. IQ mixer 1236 is configured to minimize or eliminate any contribution to a demodulation signal 1241 at the I output caused by phase modulation in the reflected signal 1230.

A synchronous detector 1242 converts the fluctuation in the I output signal at modulation frequency $f_m$ into a DC frequency error voltage 1244 representing the magnitude of the fluctuation. By maintaining the inputs to the Q mixer in quadrature, the synchronous detector produces a frequency error voltage proportional only to any amplitude modulation of the reflected signal and thereby the frequency error $f_c$-$f_{Res}$, which in turn reduces the frequency error in the oscillator loop towards zero. This DC voltage is then amplified and preferably integrated 1246 to produce the Pound-servo voltage 1220 that is fed to summing node 1222.

A portion 1262 of the Q output of IQ mixer 1234 is sampled and fed to a bandpass filter 1262 that band pass filters and amplifies the signal to produce broadband phase correction voltage 1260 that is fed to summing node 1222.

A frequency-stabilized output signal 1250 is taken from a different output 1242 positioned after the reference resonator 1202 in the oscillator loop 1204, which typically results in reduced noise in the oscillator output due to the filtering action of the reference resonator 1202. However, the output might equally well be taken from before the reference resonator without affecting the function of the microwave source.

While several illustrative embodiments of the disclosure have been shown and described, numerous variations and alternate embodiments will occur to those skilled in the art. Such variations and alternate embodiments are contemplated, and can be made without departing from the spirit and scope of the disclosure as defined in the appended claims.

We claim:

1. A frequency-stabilized microwave source, comprising:
   an oscillator configured to produce a signal including a carrier at a microwave carrier frequency $f_c$ and having a tuning port responsive to a tuning voltage to control the frequency $f_c$;
   a Pound-stabilization loop comprising:
   a modulation source configured to generate a modulation signal at modulation frequency $f_m$, said modulation signal configured to add upper and lower sidebands at $f_c+f_m$ and $f_c-f_m$ to the signal;
   a reference resonator having a center frequency $f_{Res}$ configured to receive at least a portion of the signal and to produce a reflected carrier and reflected upper and lower sidebands, a portion of the reflected upper and lower sidebands being representative of amplitude modulation (AM) of the reflected carrier at modulation frequency $f_m$ and an indicator of a frequency error $f_c$-$f_{Res}$;
   an AM detector responsive to the reflected signal to produce a demodulation signal representative of the amplitude modulation of the reflected carrier at modulation frequency fm;
   a synchronous detector that mixes the demodulation signal with the modulation signal to produce a frequency error voltage indicative of the frequency error $f_c$-$f_{Res}$; and
   an integrator that integrates the frequency error voltage to produce a Pound-servo voltage that controls the tuning voltage to reduce the frequency error towards zero,
   wherein the AM detector comprises an IQ mixer having LO and RF input ports and I and Q output ports, wherein the RF input port receives the reflected signal and the demodulation signal is produced at the I output port,
   wherein the IQ mixer produces a phase error voltage indicative of a phase difference between the carrier and the reflected carrier at the Q output port,
   an LO phase shifter responsive to the phase error voltage, that samples the signal and produces a phase-shifted signal,
   wherein the phase-shifted signal is applied to the LO input port of the IQ mixer such that the demodulation signal produced at the I output port is insensitive to phase modulation in the reflected signal and suppresses close-in phase noise near carrier frequency fc; and
   a bandpass filter (BPF) coupled to the IQ mixer's Q output to filter the phase error voltage to produce a broadband phase correction voltage that is added to the Pound-servo voltage to suppress wideband phase noise.

2. The frequency-stabilized microwave source of claim 1, wherein the close-in phase noise lies between the carrier frequency $f_c$ and a cross-over frequency $f_{cross-over}$ and the wideband phase noise lies above the cross-over frequency $f_{cross-over}$.

3. The frequency-stabilized microwave source of claim 1, wherein to suppress the wideband phase noise without degrading the close-in phase noise the BPF is characterized by a low frequency cutoff $f_{cLow}$>$f_m$ designed to minimize muting of the modulation signal, a high frequency cutoff $f_{cHigh}$ designed to allow gain margin >0 dB and phase margin >0 deg for closed-loop stability and sufficient gain in a passband between the low and high frequency cutoffs to reach a noise floor of the IQ mixer.

4. The frequency-stabilized microwave source of claim 1, further comprising a lowpass filter (LPF) or integrator between the Q output port and the LO phase shifter.

5. The frequency-stabilized microwave source of claim 1, further comprising:
   a summing node at the input to the LPF or integrator, said summing node configured to sum the phase error voltage at the Q output port and a quadrature compensation voltage having a magnitude set to reduce sensitivity of the demodulation signal to phase modulation in the reflected signal,
   wherein the BPF samples the phase error voltage at the Q output port prior to the summing node.

6. The frequency-stabilized microwave source of claim 1, wherein the IQ mixer comprises:
   an I mixer having an LO input port, an RF input port and the I output port;

a Q mixer having an LO input port, an RF input port and the Q output port;

a first microwave power splitter between the IQ mixer's LO input port and the LO input ports of the I and Q mixers that receives the phase-shifted signal and produces first and second LO signals;

a second microwave power splitter between the IQ mixer's RF input port and the RF input ports of the I and Q mixers that receives the reflected signal and produces first and second RF signals having the same phase;

wherein the first and second microwave power splitters are arranged to produce first and second relative phases between the first LO signal and first RF signal and second LO signal and second RF signal, respectively, the difference between first and second relative phases being 90°, and wherein the phase-shifted signal is applied to the LO input port of the IQ mixer such that the second LO signal and the second RF signal at the LO input port and RF input port of the Q mixer, respectively, are maintained in quadrature such that the demodulation signal produced at the I output port is insensitive to phase modulation in the reflected signal.

7. The frequency-stabilized microwave source of claim 1, wherein the 5 Hz<$f_m$<5 KHz.

8. The frequency-stabilized microwave source of claim 1, wherein the oscillator comprises a voltage-controlled oscillator (VCO) having the tuning port that generates the signal, wherein the reference resonator is separate from the VCO.

9. The frequency-stabilized microwave source of claim 8, further comprising:

a phase shifter at the output of the VCO, said phase shifter responsive to the modulation signal to apply phase modulation to the signal to add the upper and lower sidebands.

10. The frequency-stabilized microwave source of claim 2, further comprising:

a summing node at the tuning port of the VCO, said summing node responsive to the modulation signal and the frequency error voltage to frequency modulate carrier frequency $f_c$.

11. The frequency-stabilized microwave source of claim 1, wherein the oscillator includes the reference resonator as a frequency-determining element within an oscillator loop, further comprising a first phase shifter in the oscillator loop, said phase shifter having the tuning report responsive to the tuning voltage to control the frequency $f_c$.

12. The frequency-stabilized microwave source of claim 11, further comprising:

a second phase shifter in the oscillator loop responsive to the modulation signal to apply phase modulation to the signal to add the upper and lower sidebands.

13. The frequency-stabilized microwave source of claim 12, wherein the first and second phase shifters are a common phase shifter, further comprising a summing node that sums the modulation signal and the frequency error voltage.

14. An amplitude modulation (AM) and phase modulation (PM) detector for a Pound-stabilized microwave source in which a reference resonator having a center frequency $f_{Res}$ is configured to reflect a signal including a carrier at carrier frequency $f_c$ and upper and lower sidebands at $f_c+f_m$ and $f_c-f_m$ at modulation frequency $f_m$ of a modulation signal, the AM and PM detector comprising:

an IQ mixer having LO and RF input ports and I and Q output ports;

wherein the RF input port is configured to receive a reflected signal including a reflected carrier and reflected upper and lower sidebands, a portion of the reflected upper and lower sidebands being representative of AM of the reflected carrier at modulation frequency $f_m$ and an indicator of a frequency error $f_c-f_{Res}$;

wherein the IQ mixer is configured to produce a demodulation signal representative of the amplitude modulation of the reflected carrier at modulation frequency $f_m$ at the I output port;

wherein the IQ mixer is configured to produce a phase error voltage indicative of a phase difference between the carrier and the reflected carrier at the Q output port, an LO phase shifter responsive to the phase error voltage, that samples the signal and produces a phase-shifted signal, wherein the phase-shifted signal is applied to the LO input port of the IQ mixer such that the demodulation signal produced at the I output port is insensitive to phase modulation in the reflected signal, a synchronous detector that mixes the demodulation signal with the modulation signal to produce a frequency error voltage indicative of the frequency error $f_c-f_{Res}$;

an integrator that integrates the frequency error voltage to produce a Pound-servo voltage;

a bandpass filter (BPF) coupled to the IQ mixer's Q output to filter the phase error voltage to produce a broadband phase correction voltage; and a summing node that sums the Pound-servo voltage and the broadband phase correction voltage to suppress close-in phase noise near carrier frequency $f_c$ and suppress wideband phase noise above carrier frequency $f_c$ in the Pound-stabilized source.

15. The frequency-stabilized microwave source of claim 14, wherein the close-in phase noise lies between the carrier frequency $f_c$ and a cross-over frequency $f_{cross-over}$ and the wideband phase noise lies above the cross-over frequency $f_{cross-over}$.

16. The frequency-stabilized microwave source of claim 15, wherein to suppress the wideband phase noise without degrading the close-in phase noise the BPF is characterized by a low frequency cutoff $f_{cLow}>f_m$ designed to minimize muting of the modulation signal, a high frequency cutoff $f_{cHigh}$ designed to allow gain margin >0 dB and phase margin >0 deg for closed-loop stability and sufficient gain in a passband between the low and high frequency cutoffs to reach a noise floor of the IQ mixer.

17. The frequency-stabilized microwave source of claim 14, further comprising a lowpass filter (LPF) or integrator between the Q output port and the LO phase shifter.

18. The frequency-stabilized microwave source of claim 14, further comprising:

a summing node at the input to the LPF or integrator, said summing node configured to sum the phase error voltage at the Q output port and a quadrature compensation voltage having a magnitude set to reduce sensitivity of the demodulation signal to phase modulation in the reflected signal, wherein the BPF samples the phase error voltage at the Q output port prior to the summing node.

19. The frequency-stabilized microwave source of claim 14, wherein the IQ mixer comprises:

an I mixer having an LO input port, an RF input port and the I output port;

a Q mixer having an LO input port, an RF input port and the Q output port;

a first microwave power splitter between the IQ mixer's LO input port and the LO input ports of the I and Q mixers that receives the phase-shifted signal and produces first and second LO signals;

a second microwave power splitter between the IQ mixer's RF input port and the RF input ports of the I and Q mixers that receives the reflected signal and produces first and second RF signals;

wherein the first and second microwave power splitters are arranged to produce first and second relative phases between the first LO signal and first RF signal and second LO signal and second RF signal respectively, the difference between first and second relative phases being 90°, wherein the phase-shifted signal is applied to the LO input port of the IQ mixer such that the second LO signal and the second RF signal at the LO input port and RF input port of the Q mixer, respectively, are maintained in quadrature such that the demodulation signal produced at the I output port is insensitive to phase modulation in the reflected signal.

* * * * *

UNITED STATES PATENT AND TRADEMARK OFFICE
CERTIFICATE OF CORRECTION

| | |
|---|---|
| PATENT NO. | : 11,817,872 B1 |
| APPLICATION NO. | : 18/095855 |
| DATED | : November 14, 2023 |
| INVENTOR(S) | : Dervay et al. |

It is certified that error appears in the above-identified patent and that said Letters Patent is hereby corrected as shown below:

On the Title Page

On page 2, in Column 1, Item (56) under "Other Publications", Line 11, delete ""Cryyogenic" and insert --"Cryogenic-- therefor In the Specification In Column 1, Line 41, delete "2N," and insert --2π,-- therefor In Column 5, Line 52, delete "fm" and insert --$f_m$-- therefor In Column 9, Line 27, delete "fc" and insert --$f_c$-- therefor In Column 9, Line 48, delete "900" and insert --90°-- therefor In Column 11, Line 17, delete "900" and insert --90°-- therefor In Column 13, Line 58, delete "I/Q" and insert --IQ-- therefor In the Claims In Column 16, Line 8, In Claim 1, delete "fm;" and insert --$f_m$;-- therefor In Column 16, Line 32, In Claim 1, delete "fc;" and insert --$f_c$;-- therefor In Column 18, Line 19, In Claim 14, delete "signal," and insert --signal;-- therefor Signed and Sealed this
Twelfth Day of November, 2024

Katherine Kelly Vidal
*Director of the United States Patent and Trademark Office*